US012652916B2

(12) United States Patent
Xiao et al.

(10) Patent No.: US 12,652,916 B2
(45) Date of Patent: Jun. 9, 2026

(54) DISPLAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Bangqing Xiao, Beijing (CN); Hai Zheng, Beijing (CN); Benlian Wang, Beijing (CN); Haigang Qing, Beijing (CN)

(73) Assignees: Chengdu BOE Optoelectronics Technology Co., Ltd., Chengdu (CN); BOE Technology Group Go., Ltd., Beijing (CN)

( * ) Notice: Subject to any disclaimer, the term of this patent is extended or adjusted under 35 U.S.C. 154(b) by 400 days.

(21) Appl. No.: 18/560,930

(22) PCT Filed: Feb. 13, 2023

(86) PCT No.: PCT/CN2023/075680
§ 371 (c)(1),
(2) Date: Nov. 15, 2023

(87) PCT Pub. No.: WO2024/168468
PCT Pub. Date: Aug. 22, 2024

(65) Prior Publication Data
US 2025/0098450 A1     Mar. 20, 2025

(51) Int. Cl.
*H10K 59/131* (2023.01)
*H10K 59/121* (2023.01)
*H10K 59/126* (2023.01)

(52) U.S. Cl.
CPC ....... *H10K 59/131* (2023.02); *H10K 59/1213* (2023.02); *H10K 59/126* (2023.02)

(58) Field of Classification Search
CPC . H10K 59/131; H10K 59/1213; H10K 59/126
See application file for complete search history.

(56) References Cited

U.S. PATENT DOCUMENTS

2023/0178017 A1*  6/2023  Wang ................... H10D 86/441
345/55

* cited by examiner

*Primary Examiner* — Samuel A Gebremariam
(74) *Attorney, Agent, or Firm* — Ling Wu; Stephen Yang; Ling and Yang Intellectual Property

(57) ABSTRACT

A display substrate includes a substrate (100), a plurality of first pixel circuits (11), a plurality of second pixel circuits (12), a plurality of first light emitting elements (13), a plurality of second light emitting elements (14), at least one first reset control line (RST1), at least one first data line (51) and at least one first shielding wire (61). The first data line (51) at least includes a first sub-data line (511), a second sub-data line (512), and a first data transfer line (514) connecting the first sub-data line (511) and the second sub-data line (512). In a direction perpendicular to the display substrate, a first shielding wire (61) is located between a first reset control line (RST1) and a first data transfer line (514).

20 Claims, 34 Drawing Sheets

DISPLAY SUBSTRATE AND DISPLAY APPARATUS

CROSS-REFERENCE TO RELATED APPLICATION

The present application is a U.S. National Phase Entry of International Application No. PCT/CN2023/075680 having an international filing date of Feb. 13, 2023. The above-identified application is hereby incorporated by reference.

TECHNICAL FIELD

The present disclosure relates to, but is not limited to, the display technologies, and in particular to a display substrate and a display apparatus.

BACKGROUND

An Organic Light Emitting Diode (OLED) and a Quantum dot Light Emitting Diode (QLED) are active light emitting display devices and have advantages of self-luminescence, a wide viewing angle, a high contrast ratio, low power consumption, an extremely high response speed, lightness and thinness, bendability, and a low cost, etc. An under screen camera technology is a brand-new technology proposed for increasing a screen-to-body ratio of a display apparatus.

SUMMARY

The following is a summary of subject matter described herein in detail. The summary is not intended to limit the protection scope of claims.

Embodiments of the present disclosure provide a display substrate and a display apparatus.

In one aspect, an embodiment of the present disclosure provides a display substrate, including a substrate, a plurality of pixel circuits, a plurality of light emitting elements, at least one first reset control line, at least one first data line and at least one first shielding wire. The substrate includes a first display region and a second display region, wherein the first display region at least partially surrounds the second display region. The plurality of pixel circuits are located in the first display region and include a plurality of first pixel circuits and a plurality of second pixel circuits. The plurality of light emitting elements include a plurality of first light emitting elements located in the first display region and a plurality of second light emitting elements located in the second display region. At least one first pixel circuit in the plurality of first pixel circuits is electrically connected with at least one first light emitting element in the plurality of first light emitting elements; and at least one second pixel circuit in the plurality of second pixel circuits is electrically connected with at least one second light emitting element in the plurality of second light emitting elements. The first reset control line is electrically connected to a plurality of pixel circuits arranged along the first direction. The first data line at least includes a first sub-data line, a second sub-data line and a first data transfer line. The first sub-data line is electrically connected to a plurality of pixel circuits in the first display region located on a side of the second display region in the second direction, and the second sub-data line is electrically connected to a plurality of second pixel circuits in the first display region located on a side of the second display region in the first direction. The first data transfer line extends at least along the first direction and electrically connects the first sub-data line and the second sub-data line. The first direction intersects with the second direction. In a direction perpendicular to the display substrate, the first shielding wire is located between the first reset control line and the first data transfer line. At least a portion of the orthographic projection of the first shielding wire on the substrate is located between the orthographic projection of the first data transfer line on the substrate and an orthographic projection of the first reset control line on the substrate.

In some exemplary implementations, the orthographic projection of the first shielding wire on the substrate is overlapped with the orthographic projection of the first data transfer line on the substrate.

In some exemplary implementations, the first data transfer line includes a main body portion extending along the first direction and a protrusion portion extending from the main body portion in the second direction. The orthographic projection of the first shielding wire on the substrate at least covers an edge of the main body portion of the first data transfer line close the first reset control line; or, the orthographic projection of the first shielding wire on the substrate is not overlapped with the orthographic projection of the main body portion of the first data transfer line on the substrate.

In some exemplary implementations, the orthographic projection of the main body portion of the first data transfer line on the substrate is within a range of the orthographic projection of the first shielding wire on the substrate.

In some exemplary implementations, at least one of the plurality of pixel circuits includes an anode reset transistor electrically connected to a second initial signal line or a third initial signal line, and is configured to reset an anode connection node of the pixel circuit by using a second initial signal provided by the second initial signal line or a third initial signal provided by the third initial signal line. The first shielding wire is electrically connected to the second initial signal line or the third initial signal line.

In some exemplary implementations, an anode reset transistor of the first pixel circuit is electrically connected to the second initial signal line, and an anode reset transistor of the second pixel circuit is electrically connected to the third initial signal line.

In some exemplary implementations, the first shielding wire and the second initial signal line or the third initial signal line are of an integral structure.

In some exemplary implementations, an insulation layer is provided between a film layer on which the first shielding wire is located and a film layer on which the second initial signal line or the third initial signal line is located, and the first shielding wire is electrically connected in parallel with the second initial signal line or the third initial signal line through a via hole opened on the insulation layer.

In some exemplary implementations, the display substrate further includes at least one first shielding electrode, which is located on a side of a transfer hole between the first data transfer line and the first sub-data line or the second sub-data line close to the first reset control line, and the first shielding electrode is electrically connected to the second initial signal line or the third initial signal line.

In some exemplary implementations, an orthographic projection of the first shielding electrode on the substrate is overlapped with an orthographic projection of the first reset control line on the substrate.

In some exemplary implementations, the at least one pixel circuit further includes a first reset transistor and a drive transistor, wherein the first reset transistor is electrically connected to the first reset control line, the first initial signal line and a gate of the drive transistor, and is configured to reset the gate of the drive transistor by using a first initial signal provided by the first initial signal line under control of the first reset control line. An orthographic projection of the first initial signal line on the substrate is located on a side of the orthographic projection of the first reset control line on the substrate close to the drive transistor.

In some exemplary implementations, the first shielding wire is electrically connected to a peripheral power supply line.

In some exemplary implementations, the first reset control line, the first shielding wire, and the first data transfer line are sequentially arranged along a direction away from the substrate.

In some exemplary implementations, the first reset control line is located in a first conductive layer, and the first shielding wire is located in a second conductive layer, which is located on a side of the first conductive layer away from the substrate, wherein an inorganic insulation layer is arranged between the first conductive layer and the second conductive layer; and the first data transfer line is located on a side of the second conductive layer away from the substrate.

In some exemplary implementations, the first data transfer line is located on a side of the first sub-data line and the second sub-data line close to the substrate, and the first sub-data line and the second sub-data line are of a same layer structure.

In some exemplary implementations, the first data transfer line is located on a side of the first sub-data line and the second sub-data line away from the substrate, and the first sub-data line and the second sub-data line are of a same layer structure. The first sub-data line is located on a side of the first shielding wire away from the substrate, and at least one conductive layer is arranged between a film layer on which the first sub-data line is located and a film layer on which the first shielding wire is located.

In some exemplary implementations, the display substrate further includes a plurality of first compensation wires; and the plurality of first compensation wires and the first data transfer line are arranged in the same layer, and an extension direction of the plurality of first compensation wires is the same as that of the first data transfer line.

In some exemplary implementations, the plurality of first compensation wires are electrically connected to the peripheral power supply line.

In another aspect, an embodiment of the present disclosure provides a display apparatus, which includes the aforementioned display substrate.

In another aspect, an embodiment of the present disclosure provides a display substrate, including a substrate, a plurality of pixel circuits, a plurality of light emitting elements, at least one first reset control line, at least one first data line and at least one first shielding wire. The substrate includes a first display region and a second display region, wherein the first display region at least partially surrounds the second display region. The plurality of pixel circuits are located in the first display region and include a plurality of first pixel circuits and a plurality of second pixel circuits. The plurality of light emitting elements include a plurality of first light emitting elements located in the first display region and a plurality of second light emitting elements located in the second display region. At least one first pixel circuit in the plurality of first pixel circuits is electrically connected with at least one first light emitting element in the plurality of first light emitting elements; and at least one second pixel circuit in the plurality of second pixel circuits is electrically connected with at least one second light emitting element in the plurality of second light emitting elements. The first reset control line is electrically connected to a plurality of pixel circuits arranged along the first direction. The first data line at least includes a first sub-data line, a second sub-data line and a first data transfer line. The first sub-data line is electrically connected to a plurality of pixel circuits in the first display region located on a side of the second display region in the second direction, and the second sub-data line is electrically connected to a plurality of second pixel circuits in the first display region located on a side of the second display region in the first direction. The first data transfer line extends at least along the first direction and electrically connects the first sub-data line and the second sub-data line. The first direction intersects with the second direction. At least one conductive layer is arranged between a film layer on which the first reset control line is located and a film layer on which the first data transfer line is located, and the first shielding wire is located in the conductive layer; and an orthographic projection of the first shielding wire on the substrate is overlapped with an orthographic projection of the first data transfer line on the substrate, or the orthographic projection of the first shielding wire on the substrate is located between an orthographic projection of the first reset control line on the substrate and the orthographic projection of the first data transfer line on the substrate.

In some exemplary implementations, at least two conductive layers are arranged between the film layer on which the first reset control line is located and the film layer on which the first data transfer line is located, and the first shielding wire is located in a conductive layer between the at least two conductive layers closest to the first reset control line.

In some exemplary implementations, the first shielding wire is electrically connected to the peripheral power supply line or the initial signal line in the first display region.

Other aspects may be understood upon reading and understanding the drawings and detailed description.

BRIEF DESCRIPTION OF DRAWINGS

Accompanying drawings are used for providing further understanding of technical solutions of the present disclosure, constitute a part of the specification, and are used for explaining the technical solutions of the present disclosure together with the embodiments of the present disclosure, but do not constitute limitations on the technical solutions of the present disclosure. Shapes and sizes of one or more components in the drawings do not reflect actual scales, and are only intended to schematically describe contents of the present disclosure.

DETAILED DESCRIPTION

Figure 1:
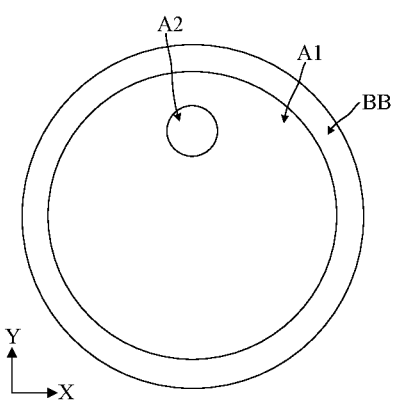
FIG. 1 is a schematic diagram of a display substrate according to at least one embodiment of the present disclosure.

The embodiments of the present disclosure will be described below with reference to the drawings in detail. Implementations may be practiced in a plurality of different forms. Those of ordinary skills in the art may easily understand such a fact that modes and contents may be transformed into other forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, one mode of the present disclosure is not necessarily limited to the size, and a shape and a size of one or more components in the drawings do not reflect an actual scale. In addition, the drawings schematically illustrate ideal examples, and one implementation of the present disclosure is not limited to shapes, numerical values, or the like shown in the drawings.

Ordinal numerals such as "first", "second", and "third" in the specification are set to avoid confusion between constiuent elements, but not to set a limit in quantity. In the present disclosure, "a plurality/multiple" represents two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to a direction where the constituent elements are described. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, a detachable connection, or an integrated connection; it may be a mechanical connection or a connection; it may be a direct connection, an indirect connection through a middleware, or an internal communication inside between two components. Those of ordinary skills in the art may understand meanings of the above-mentioned terms in the present disclosure according to situations.

In the specification, "electrical connection" includes a case that constituent elements are connected together through an element with a certain electrical effect. The "element with the certain electrical effect" is not particularly limited as long as electrical signals between the connected constituent elements may be transmitted. Examples of the "element having some electrical function" not only include an electrode and a wiring, but also include a switching element such as a transistor, a resistor, an inductor, a capacitor, and another element with a plurality of functions, etc.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. In the specification, the channel region refers to a region through which a current mainly flows.

In the specification, to distinguish two electrodes of a transistor except a gate electrode, one of the electrodes is referred to as a first electrode and the other electrode is referred to as a second electrode. The first electrode may be a source electrode or a drain electrode, and the second electrode may be a drain electrode or a source electrode. In addition, the gate electrode of the transistor is referred to as a control electrode. In a case that transistors with opposite polarities are used, or in a case that a direction of a current is changed during operation of a circuit, or the like, functions of the "source electrode" and the "drain electrode" are sometimes interchangeable. Therefore, the "source electrode" and the "drain electrode" are interchangeable in the specification.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

A triangle, rectangle, trapezoid, pentagon, or hexagon, etc. in this specification is not strictly defined, and it may be an approximate triangle, rectangle, trapezoid, pentagon, or hexagon, etc. There may be some small deformations caused by tolerance, and there may be a chamfer, an arc edge, and a deformation, etc.

A "light transmission rate" in the present disclosure refers to an ability of light passing through a medium, and is a percentage of luminous flux passing through a transparent or translucent body to its incident luminous flux.

In the present disclosure, "about" and "substantially" refer to that a boundary is not defined strictly and a case within a range of process and measurement errors is allowed. In the present disclosure, "substantially the same" refers to a case where values differ by less than 10%.

In the present disclosure, "A extends along a B direction" means that A may include a main body portion and a secondary portion connected with the main body portion, the main body portion is a line, a line segment, or a strip-shaped body, the main body portion extends along the B direction, and a length of the main body portion extending along the B direction is greater than a length of the secondary portion extending along another direction. In following description, "A extends in a B direction" means "a main body portion of A extends in a B direction".

FIG. 1 is a schematic diagram of a display substrate according to at least one embodiment of the present disclosure. In some examples, as shown in FIG. 1, the display substrate may include a display region and a peripheral region BB located at a periphery of the display region. The display region may include a first display region A1 and a second display region A2, and the first display region A1 may at least partially surround the second display region A2. For example, the second display region A2 may be located in the middle of the top of the display region, and the first display region A1 may surround the second display region A2. However, this embodiment is not limited thereto. For example, the second display region A2 may be located at other positions such as an upper left corner or an upper right corner of the display region, and the first display region A1 may surround at least one side of the second display region A2.

In some examples, as shown in FIG. 1, the display region of the display substrate may be circular or oval. For example, the display substrate may be applied to wearable electronic products such as watches. However, this embodiment is not limited thereto. In other examples, the display region of the display substrate may be rectangular, semicircular, pentagonal, or have another shape.

In some examples, as shown in FIG. 1, the second display region A2 may be a light-transmissive display region and may also be called an Full Display With Camera (FDC) region, and is configured to perform image display and transmitting light; and the first display region A1 may be a normal display region, and is configured to perform image display. For example, an orthographic projection of a sensor (such as a camera and other hardware) on the display substrate may be located in the second display region A2 of the display substrate. In some examples, as shown in FIG. 1, the second display region A2 may be circular and a size of the orthographic projection of the sensor on the display substrate may be less than or equal to a size of the second display region A2. However, this embodiment is not limited thereto. In other examples, the second display region A2 may be rectangular, and a size of the orthographic projection of the sensor on the display substrate may be less than or equal to a size of an inscribed circle of the second display region A2.

In some examples, as shown in FIG. 1, a ratio of a resolution of the first display region A1 to a resolution of the second display region A2 may be about 0.8 to 1.2. Alternatively, the resolution of the second display region A2 may be approximately the same as that of the first display region A1. For example, the resolution of the second display region A2 may be greater than 400PPI.

In some examples, the display region may include a plurality of pixel units, and one pixel unit may include three sub-pixels, which may be, for example, a red sub-pixel, a green sub-pixel, and a blue sub-pixel respectively. However, this embodiment is not limited thereto. In some other examples, one pixel unit may include four sub-pixels, which may be a red sub-pixel, a green sub-pixel, a blue sub-pixel, and a white sub-pixel respectively.

In some examples, at least one sub-pixel may include a pixel circuit and a light emitting element. The pixel circuit may be configured to drive a corresponding light emitting element to emit light. For example, the pixel circuit may be configured to provide a drive current for driving the light emitting element to emit light. The pixel circuit may include a plurality of transistors and at least one capacitor. For example, the pixel circuit may have a 3T1C, 4T1C, 5T1C, 5T2C, 6T1C, 7T1C or 8T1C structure. In the above circuit structure, T refers to a thin film transistor, C refers to a capacitor, a number before T represents a quantity of thin film transistors in the circuit, and a number before C represents a quantity of capacitors in the circuit.

In some example, the plurality of transistors in the pixel circuit may be P-type transistors, or may be N-type transistors. Using a same type of transistors in a pixel circuit may simplify a process flow, reduce a process difficulty of a display substrate, and improve a yield of products. In some other examples, a plurality of transistors in the pixel circuit may include P-type transistors and N-type transistors.

In some examples, low temperature polysilicon thin film transistors, or oxide thin film transistors, or both of a low temperature polysilicon thin film transistor and an oxide thin film transistor, may be adopted for a plurality of transistors in a pixel circuit. An active layer of a low temperature poly-crystalline silicon thin film transistor is made of Low Temperature Poly-crystalline Silicon (LTPS), and an active layer of an oxide thin film transistor is made of an oxide semiconductor (Oxide). The low temperature poly silicon thin film transistor has advantages such as a high migration rate and fast charging, and the oxide thin film transistor has advantages such as a low leakage current. The low temperature poly silicon thin film transistor and the oxide thin film transistor are integrated on one display substrate, that is, an LTPS+Oxide (LTPO for short) display substrate, so that advantages of the low temperature poly silicon thin film transistor and the oxide thin film transistor may be utilized, low-frequency drive may be achieved, power consumption may be reduced, and display quality may be improved.

In some examples, the light emitting element may be any of a Light Emitting Diode (LED), an Organic Light Emitting Diode (OLED), a Quantum dot Light Emitting Diode (QLED), a micro LED (including: mini-LED or micro-LED), and the like. For example, the light emitting element may be an OLED, and the light emitting element may emit red light, green light, blue light, or white light, etc. under drive of its corresponding pixel circuit. A color of light emitted from the light emitting element may be determined as required. In some examples, the light emitting element may include an anode, a cathode, and an organic emitting layer arranged between the anode and the cathode. The anode of the light emitting element may be electrically connected with a corresponding pixel circuit. However, this embodiment is not limited thereto.

In some examples, a shape of the light emitting element may be a rectangle, a rhombus, a pentagon, or a hexagon. When one pixel unit includes three sub-pixels, light emitting elements of the three sub-pixels may be arranged side by side horizontally, side by side vertically, or in a manner like a Chinese character "品". When one pixel unit includes four sub-pixels, light emitting elements of the four sub-pixels may be arranged side by side horizontally, side by side vertically, or in a manner to form a square. However, this embodiment is not limited thereto.

In some examples, in order to improve a light transmittance of the second display region A2, only the light emitting element may be arranged in the second display region A2, and the pixel circuit for driving the light emitting element of the second display region A2 is arranged in the first display region A1. That is, the light transmittance of the second display region A2 is improved by separately arranging the light emitting element and the pixel circuit. In this example, no pixel circuit is provided in the second display region A2.

Figure 2:
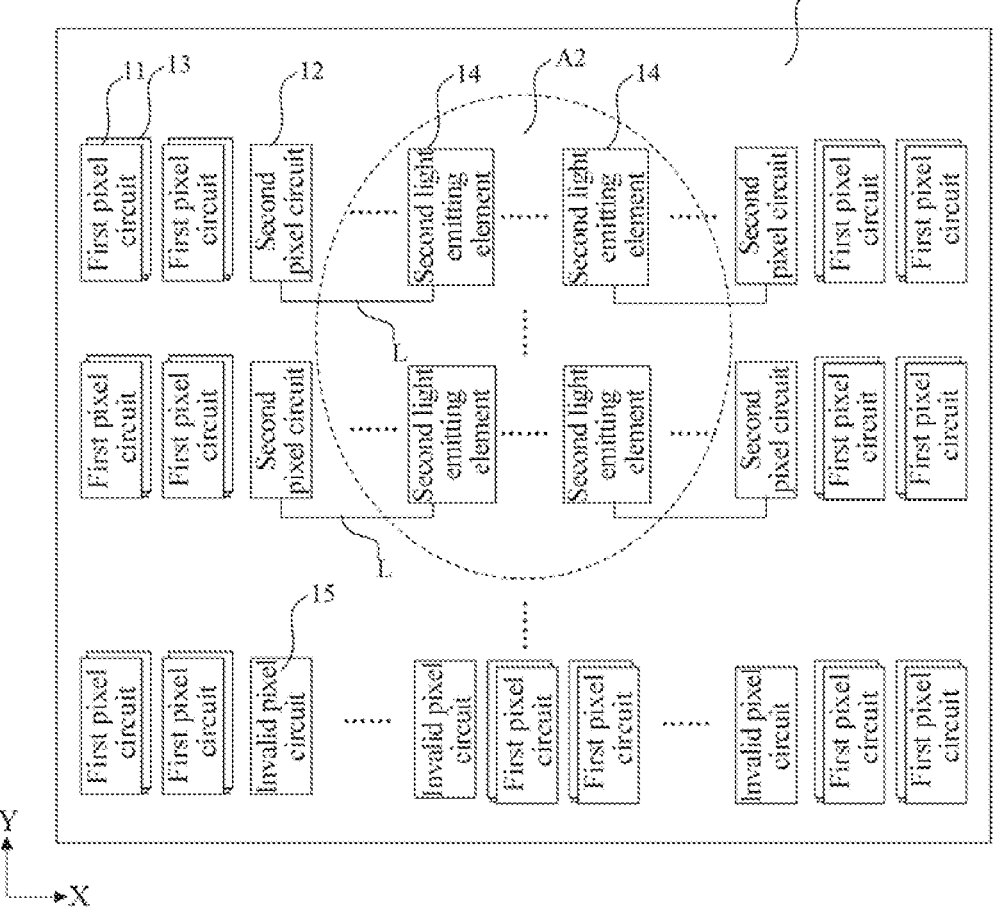
FIG. 2 is a schematic diagram of a partial structure of a display substrate according to at least one embodiment of the present disclosure.

FIG. 2 is a schematic diagram of a partial structure of a display substrate according to at least one embodiment of the present disclosure. In some examples, as shown in FIG. 2, the display substrate may at least include a plurality of pixel circuits, and a plurality of first light emitting elements 13 located in the first display region A1, and a plurality of second light emitting elements 14 located in the second display region A2. The plurality of pixel circuits of the first display region A1 may include a plurality of first pixel circuits 11, a plurality of second pixel circuits 12 and a plurality of invalid pixel circuits 15.

In some examples, as shown in FIG. 2, at least one first pixel circuit 11 in the plurality of first pixel circuits 11 may be electrically connected with at least one first light emitting element 13 in the plurality of first light emitting elements 13, and an orthographic projection of the at least one first pixel circuit 11 on the substrate may be at least partially overlapped with an orthographic projection of the at least one first light emitting element 13 on the substrate. The first pixel circuit 11 may be configured to provide a drive signal to the first light emitting element 13 with which the first pixel circuit 11 is connected, to drive the first light emitting element 13 to emit light. For example, the plurality of first pixel circuits 11 and the plurality of first light emitting elements 13 may have a one-to-one relationship or may have a one-to-many relationship.

In some examples, as shown in FIG. 2, at least one second pixel circuit 12 of the plurality of second pixel circuits 12 may be electrically connected with at least one second light emitting element 14 of the plurality of second light emitting elements 14 through a conductive line L. The second pixel circuit 12 may be configured to provide a drive signal to a second light emitting element 14 with which the second pixel circuit 12 is connected, to drive the second light emitting element 14 to emit light. For example, the plurality of second pixel circuits 12 and the plurality of second light emitting elements 14 may have a one-to-one relationship or may have in a one-to-many relationship. Because the second light emitting element 14 and the second pixel circuit 12 are located in different regions, there may be no overlapping portion between an orthographic projection of at least one second pixel circuit 12 on the substrate and an orthographic projection of at least one second light emitting element 14 on the substrate.

In some examples, a density of second light emitting elements 14 in the second display region A2 may be approximately equal to a density of first light emitting elements 13 of the first display region A1. That is, a resolution of the second display region A2 may be approximately the same as that of the first display region A1. However, this embodiment is not limited thereto. For example, a density of the second light emitting elements 14 may be larger or smaller than that of the first light emitting elements 13. That is, the resolution of the second display region A2 may be larger or smaller than that of the first display region A1.

In some examples, a light emitting area of a single second light emitting element 14 may be smaller than a light emitting area of a single first light emitting element 13. That is, the light emitting area of the first light emitting element 13 may be larger than that of the second light emitting element 14. Herein, a light emitting area of a single light emitting element may correspond to an area of a pixel opening of a pixel definition layer. In some examples, in the second display region A2, a transmissive region may be provided between adjacent second light emitting elements 14. For example, a plurality of transmissive regions may be connected with each other to form a continuous transmissive region separated by a plurality of second light emitting elements 14. The conductive line L may be made of a transparent conductive material to improve a light transmittance of the transmissive region as much as possible.

Figure 3:
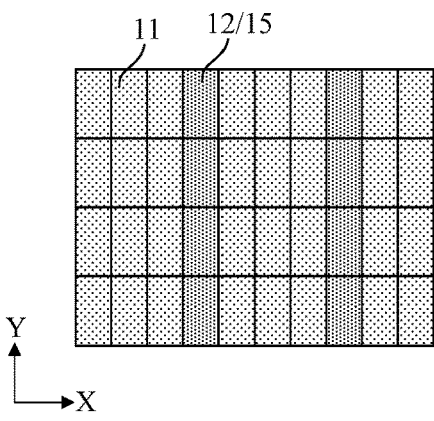
FIG. 3 is a schematic diagram of an arrangement of a plurality of the pixel circuits of the first display region according to at least one embodiment of the present disclosure.

FIG. 3 is a schematic diagram of an arrangement of a plurality of the pixel circuits of the first display region according to at least one embodiment of the present disclosure. In some examples, as shown in FIG. 3, the plurality of pixel circuits arranged sequentially along the first direction X may be referred to as a row of pixel circuits, and the plurality of pixel circuits arranged sequentially along the second direction Y may be referred to as a column of pixel circuits. The first direction X intersects with the second direction Y, for example, the first direction X may be perpendicular to the second direction Y.

In some examples, as shown in FIG. 2 and FIG. 3, the plurality of second pixel circuits 12 may be arranged at intervals between the plurality of first pixel circuits 11, and the plurality of invalid pixel circuits 15 may be arranged at intervals between the plurality of first pixel circuits 11. For example, the plurality of first pixel circuits 11 may be arranged between two adjacent second pixel circuits 12 in the first direction X, and the plurality of first pixel circuits 11 may be arranged between two adjacent invalid pixel circuits 15. In this example, by providing the invalid pixel circuit 15, it is advantageous to improve the uniformity of the components of a plurality of film layers in the etching process. For example, a structure of the invalid pixel circuit 15 may be substantially the same as that of the second pixel circuit 12 of a row or column in which the invalid pixel circuit is located, except that it is not electrically connected with any light emitting element.

In some examples, because the first display region A1 is provided with not only a first pixel circuit 11 electrically connected with a first light emitting element 13, but also a second pixel circuit 12 electrically connected with a second light emitting element 14, a quantity of pixel circuits of the first display region A1 is greater than a quantity of first light emitting elements 13. In some examples, a region for disposing newly added pixel circuits (including a second pixel circuit 12 and an invalid pixel circuit 15) may be obtained by reducing a size of a first pixel circuit 11 in the first direction X. For example, a size of a pixel circuit in the first direction X may be smaller than a size of a first light emitting element in the first direction X.

In some examples, as shown in FIG. 3, original every a columns of pixel circuits may be compressed along the first direction X, so that arrangement space of one column of pixel circuits may be added, and space occupied by a columns of pixel circuits before compression and space occupied by a+1 columns of pixel circuits after compression may be the same. Herein, a may be an integer greater than 1. In this example, a may be equal to 3. However, this embodiment is not limited thereto. For example, a may be 2 or 4, or the like.

In some examples, as shown in FIG. 2, the first display region A1 may include a transition region and a non-transition region. The transition region may be located on at least one side of the second display region A2 along the first direction X, which is located, for example, on opposite sides of the second display region A2. All regions in the first display region A1 except the transition region may belong to the non-transition region. The second pixel circuit 12 may be located in the transition region in the first display region A1, and the invalid pixel circuit 15 may be located in the non-transition region. However, this embodiment is not limited thereto. In other examples, the second pixel circuit 12 may be arranged only in the transition region, and the invalid pixel circuit may be not arranged in the non-transition region. In another example, the second pixel circuit 12 and the invalid pixel circuit 15 may be arranged in the first display region A1 located on opposite sides (for example, left and right sides) of the second display region A2 along the first direction X, and the second pixel circuit 12 and the invalid pixel circuit 15 may not be arranged in the first display region A1 located on opposite sides (for example, upper and lower sides) of the second display region A2 along the second direction Y, or only the invalid pixel circuit 15 may be arranged in the first display region A1 located on opposite sides (for example, upper and lower sides) of the second display region A2 along the second direction Y.

Figure 4:
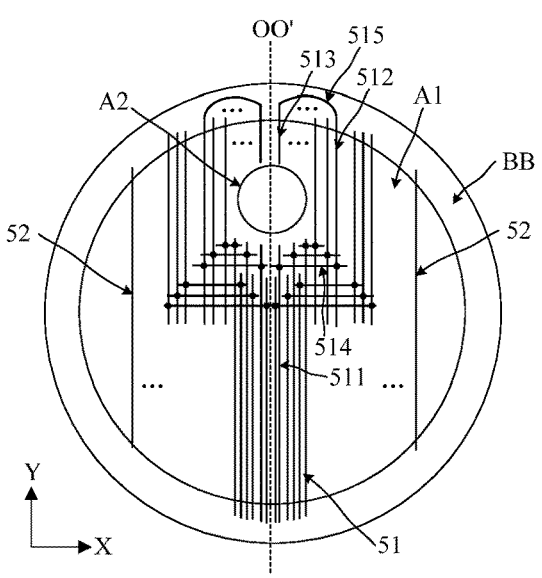
FIG. 4 is a schematic diagram of a layout of data lines of a display substrate according to at least one embodiment of the present disclosure.

FIG. 4 is a schematic diagram of a layout of data lines of a display substrate according to at least one embodiment of the present disclosure. Only several data lines are taken as an example for illustration in FIG. 4. In some examples, as shown in FIG. 4, the display substrate may have a central axis OO' in the first direction X, and the display substrate may be substantially symmetrical about the central axis OO'.

In some examples, as shown in FIG. 4, the first display region A1 may include a plurality of first data lines 51 and a plurality of second data lines 52. The first data line 51 may include a first sub-data line 511, a first data transfer line 514 and a second sub-data line 512. The first data transfer line 514 may be connected between the first sub-data line 511 and the second sub-data line 512. The first sub-data line 511 and the second sub-data line 512 may extend along the second direction Y, and the first data transfer line 514 may extend along the first direction X.

In some examples, as shown in FIG. 4, the first sub-data line 511 may be located within the first display region A1 on a side (e.g. the lower side) of the second display region A2 along the second direction Y, and is electrically connected to a column of pixel circuits (e.g. a column of first pixel circuits) within the region. The second sub-data line 512 may be located within the first display region A1 on a side (e.g. left side or right side) of the second display region A2 along the first direction X, and is electrically connected to a column of second pixel circuits within the region. One end of the first data transfer line 514 may be electrically connected to the first sub-data line 511 through a transfer hole, and the other end may be electrically connected to the second sub-data line 512 through another transfer hole. The first data transfer line 514 may be located between two adjacent rows of pixel circuits.

In some examples, as shown in FIG. 4, the first data line 51 may include a third sub-data line 513 extending along the second direction Y. The third sub-data line 513 may be located within the first display region A1 on the other side (e.g. upper side) of the second display region A2 along the second direction Y, and is electrically connected to a column of pixel circuits (e.g. a column of first pixel circuits) within the region. The peripheral region BB may be provided with a plurality of second data transfer lines 515. The third sub-data line 513 may be electrically connected with the second sub-data line 512 through the second data transfer line 515. For example a column of first pixel circuits to which the first sub-data line 511 is electrically connected and a column of first pixel circuits to which the third sub-data line 513 is electrically connected may be aligned in the second direction Y. In the present example, data signals supplied by a driver chip in a peripheral region are transmitted through a first sub-data line 511, a first data transfer line 514, a second sub-data line 512, a second data transfer line 515, and a third sub-data line 513. The first data transfer line 514 is used to bypass the second display region A2 for wiring, which may avoid direct wiring in the second display region A2 affecting the light transmittance of the second display region A2, facilitating improving the display effect. In other examples, when a side of the second display region A2 in the second direction Y is directly adjacent to the peripheral region BB, that is, when the first pixel circuit is not arranged on the upper side of the second display region A2, the third sub-data line and the second data transfer line may not be arranged.

In some examples, as shown in FIG. 4, the plurality of first sub-data lines 511 located within the first display region A1 on the lower side of the second display region A2 may be divided into a plurality of groups. In each group of first sub-data lines 511, the second sub-data line 512 to which the first sub-data line 511 close to the central axis OO' is connected may be located on a side of the second sub-data line 512 close to the second display region A2 to which the first sub-data line 511 away from the central axis OO' is connected. Within the first display region A1 on a side of the central axis OO', the arrangements of the transfer hole between the first sub-data line 511 and the first data transfer line 514, and the transfer hole between the first data transfer line 514 and the second sub-data line 512 may be substantially V-shaped structures. In each group of first sub-data lines 511, the arrangement of the transfer hole between the first sub-data line 511 and the first data transfer line 514 may be a substantially V-shaped structure, which may be, for example, substantially symmetrical about the central axis OO'.

In some examples, as shown in FIG. 4, a plurality of second data lines 52 may extend along the second direction Y, and are arranged sequentially along the first direction X. The plurality of second data lines 52 may be located within the first display region A1 on opposite sides of the second display region A2 along the first direction X. The second data line 52 may not need to be wound. The second data line 52 may be electrically connected to a column of pixel circuits (e.g. the first pixel circuits). A column of invalid pixel circuits located within the first display region A1 on a lower side of the second display region A2 may be electrically connected to a third data line (not shown).

Figure 5:
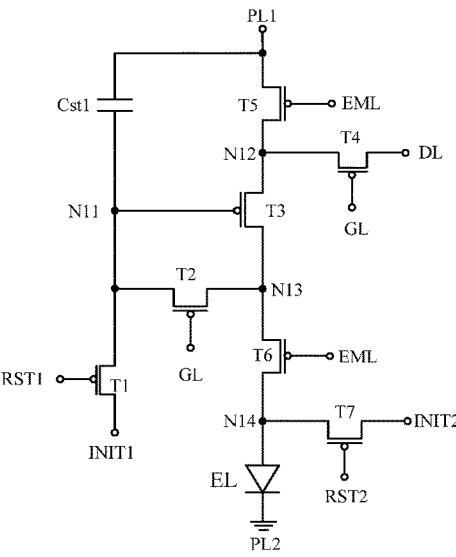
FIG. 5 is an equivalent circuit diagram of a pixel circuit according to at least one embodiment of the present disclosure.
Figure 6:
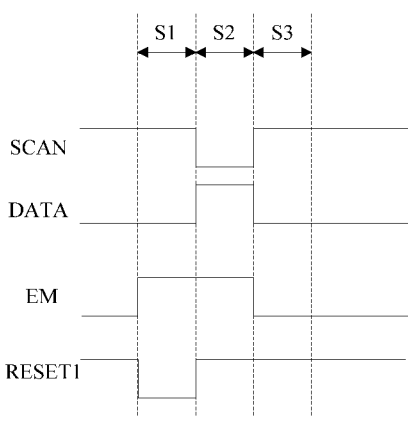
FIG. 6 is a working timing diagram of the pixel circuit shown in FIG. 5.

FIG. 5 is an equivalent circuit diagram of a pixel circuit according to at least one embodiment of the present disclosure. FIG. 6 is an operating timing diagram of the pixel circuit shown in FIG. 5. In this example, the pixel circuit may be of a 7T1C structure.

In some examples, as shown in FIG. 5, the pixel circuit may include six switching transistors (T1, T2, and T4 to T7), one drive transistor T3, and one first storage capacitor Cst1. The six switching transistors may be respectively a data writing transistor T4, a threshold compensation transistor T2, a first light emitting control transistor T5, a second light emitting control transistor T6, a first reset transistor T1, and a second reset transistor T7. In this example, the second reset transistor T7 may also be referred to as an anode reset transistor. A light emitting element EL may include an anode, a cathode, and an organic emitting layer disposed between the anode and the cathode.

In some examples, as shown in FIG. 5, a pixel circuit may be connected with a scan line GL, a data line DL, a first power supply line PL1, a second power supply line PL2, a light emitting control line EML, a first initial signal line INIT1, a second initial signal line INIT2, a first reset control line RST1, and a second reset control line RST2. In some examples, the first power supply line PL1 may be configured to provide a constant first voltage signal VDD to the pixel circuit, the second power supply line PL2 may be configured to provide a constant second voltage signal VSS to the pixel circuit, wherein the first voltage signal VDD is greater than the second voltage signal VSS. The scan line GL may be configured to provide a scan signal SCAN to the pixel circuit, the data line DL may be configured to provide a data signal DATA to the pixel circuit, the light emitting control line EML may be configured to provide a light emitting control signal EM to the pixel circuit, the first reset control line RST1 may be configured to provide a first reset control signal RESET1 to the pixel circuit, and the second reset control line RST2 may be configured to provide a second reset signal RESET2 to the pixel circuit.

In some examples, in a row of pixel circuits, a second reset control line RST2 may be connected with a scan line GL to be input with a scan signal SCAN. That is, a second reset signal RESET2 ($n$) received by a pixel circuit of an nth row is a scan signal SCAN (n) received by the pixel circuit of the nth row. However, this embodiment is not limited thereto. For example, the second reset control signal line RST2 may be inputted with a second reset control signal RESET2 different from the scan signal SCAN.

In some examples, in a pixel circuit of an n-th row, a first reset control line RST1 may be connected with a scan line GL of a pixel circuit of an (n−1)-th row to be inputted with a scan signal SCAN (n-1), that is, a first reset control signal RESET1 ($n$) is the same as the scan signal SCAN (n-1). In some examples, the first reset control line RST1 and the second reset control line RST2 may transmit the same signal. In this way, signal lines of the display substrate may be reduced, and a narrow bezel of the display substrate may be achieved.

In some examples, as shown in FIG. 5, the drive transistor T3 outputs a drive signal to drive the light emitting element EL to emit light under control of the scan signal SCAN, the data signal DATA, the first voltage signal VDD, and the second voltage signal VSS, etc. A gate of the data writing transistor T4 is electrically connected with a scan line GL, a first electrode of the data writing transistor T4 is electrically connected with a data line DL, and a second electrode of the data writing transistor T4 is electrically connected with a first electrode of the drive transistor T3. A gate of the threshold compensation transistor T2 is electrically connected with a scan line GL, a first electrode of the threshold compensation transistor T2 is electrically connected with a gate of the drive transistor T3, and a second electrode of the threshold compensation transistor T2 is electrically connected with a second electrode of the drive transistor T3. A gate of the first light emitting control transistor T5 is electrically connected with a light emitting control line EML, a first electrode of the first light emitting control transistor T5 is electrically connected with a first power supply line PL1, and a second electrode of the first light emitting control transistor T5 is electrically connected with the first electrode of the drive transistor T3. A gate of the second light emitting control transistor T6 is electrically connected with a light emitting control line EML, a first electrode of the second light emitting control transistor T6 is electrically connected with the second electrode of the drive transistor T3, and a second electrode of the second light emitting control transistor T6 is electrically connected with an anode of the light emitting element EL. The first reset transistor T1 is electrically connected with the gate of the drive transistor T3 and configured to reset the gate of the drive transistor T3, and the second reset transistor T7 is electrically connected with the anode of the light emitting element EL and configured to reset the anode of the light emitting element EL. A gate of the first reset transistor T1 is electrically connected with a first reset control line RST1, a first electrode of the first reset transistor T1 is electrically connected with a first initial signal line INIT1, and a second electrode of the first reset transistor T1 is electrically connected with the gate of the drive transistor T3. A gate of the second reset transistor T7 is electrically connected with a second reset control line RST2, a first electrode of the second reset transistor T7 is electrically connected with a second initial signal line INIT2, and a second electrode of the second reset transistor T7 is electrically connected with the anode of the light emitting element EL. A first electrode plate of the first storage capacitor Cst1 is electrically connected with the gate of the drive transistor T3, and a second electrode plate of the first storage capacitor Cst1 is electrically connected with the first power supply line PL1. A cathode of the light emitting element EL is electrically connected with the second power supply line PL2.

In this example, a first node N11 is a connection point of the first storage capacitor Cst1, the first reset transistor T1, the drive transistor T3, and the threshold compensation transistor T2, a second node N12 is a connection point of the first light emitting control transistor T5, the data writing transistor T4, and the drive transistor T3, a third node N13 is a connection point of the drive transistor T3, the threshold compensation transistor T2, and the second light emitting control transistor T6, and a fourth node N14 is a connection point of the second light emitting control transistor T6, the second reset transistor T7, and the light emitting element EL. The fourth node N14 may also be referred to as an anode connection node.

A working process of the pixel circuit shown in FIG. 5 will be described below with reference to FIG. 6. The description is given by taking a case in which a plurality of transistors included in the pixel circuit shown in FIG. 5 are all P-type transistors as an example.

In some examples, as shown in FIG. 5 and FIG. 6, during one frame display time period, the working process of the pixel circuit may include a first stage S1, a second stage S2, and a third stage S3.

The first stage S1 is referred to as a reset stage. A first reset control signal RESET1 provided by the first reset control line RST1 is a low-level signal, so that the first reset transistor T1 is turned on, and a first initial signal provided by the first initial signal line INIT1 is provided to the first node N11 to initialize the first node N11 and clear an original data voltage in the first storage capacitor Cst1. A scan signal SCAN provided by the scan line GL is a high-level signal, and a light emitting control signal EM provided by the light emitting control line EML is a high-level signal, so that the data writing transistor T4, the threshold compensation transistor T2, the first light emitting control transistor T5, the second light emitting control transistor T6, and the second reset transistor T7 are turned off. In this stage, the light emitting element EL does not emit light.

A second stage S2 is referred to as a data write stage or a threshold compensation stage. A scan signal SCAN provided by the scan line GL is a low-level signal, a first reset control signal RESET1 provided by the first reset control line RST1 and a light emitting control signal EM provided by the light emitting control line EML are both high-level signals, and the data line DL outputs a data signal DATA. In this stage, the first electrode plate of the first storage capacitor Cst1 is at a low level, such that the drive transistor T3 is turned on. The scan signal SCAN is a low-level signal, so that the threshold compensation transistor T2, the data writing transistor T4, and the second reset transistor T7 are turned on. The threshold compensation transistor T2 and the data writing transistor T4 are turned on, so that a data voltage Vdata output by the data line DL is provided to the first node N11 through the second node N12, the turned-on driving transistor T3, the third node N13, and the turned-on threshold compensation transistor T2, and the first storage capacitor Cst1 is charged with a difference between the data voltage Vdata output by the data line DL and a threshold voltage of the driving transistor T3. A voltage of a first electrode plate (that is, the first node N11) of the first storage capacitor Cst1 is Vdata−|Vth|, Vdata is the data voltage output by the data line DL, and Vth is the threshold voltage of the driving transistor T3. The second reset transistor T7 is turned on, so that a second initial signal provided by the second initial signal line INIT2 is provided to the anode of the light emitting element EL to initialize (reset) the anode of the light emitting element EL and clear a pre-stored voltage therein, so as to complete initialization, thereby ensuring that the light emitting element EL does not emit light. The first reset control signal RESET1 provided by the first reset control line RST1 is a high-level signal, so that the first reset transistor T1 is turned off. The light emitting control signal EM provided by the light emitting control signal line EML is a high-level signal, so that the first light emitting control transistor T5 and the second light emitting control transistor T6 are turned off.

A third stage S3 is referred to as a light emitting stage. A light emitting control signal EM provided by the light emitting control signal line EML is a low-level signal, and a scan signal SCAN provided by the scan line GL and a first reset control signal RESET1 provided by the first reset control line RST1 are high-level signals. The light emitting control signal EM provided by the light emitting control signal line EML is the low-level signal, so that the first light emitting control transistor T5 and the second light emitting control transistor T6 are turned on, and a first voltage signal VDD output by the first power supply line PL1 provides a drive voltage to the anode of the light emitting element EL through the turned-on first light emitting control transistor T5, the drive transistor T3, and the second light emitting control transistor T6 to drive the light emitting element EL to emit light.

In a drive process of the pixel circuit, a drive current flowing through the drive transistor T3 is determined by a voltage difference between the gate and the first electrode of the drive transistor T3. Because the voltage of the first node N11 is Vdata–|Vth|, the drive current of the drive transistor T3 is as follows.

$$I = K \times (Vgs - Vth)^2 =$$
$$K \times [(VDD - Vdata + |Vth|) - Vth]^2 = K \times [VDD - Vdata]^2$$

Among them, I is the drive current flowing through the drive transistor T3, that is, a drive current for driving the light emitting element EL; K is a constant; Vgs is the voltage difference between the gate and the first electrode of the drive transistor T3; Vth is the threshold voltage of the drive transistor T3; Vdata is the data voltage output by the data line DL; and VDD is the first voltage signal output by the first power supply line PL1.

It may be seen from the above formula that a current flowing through the light emitting element EL has nothing to do with the threshold voltage of the drive transistor T3. Therefore, the pixel circuit of this embodiment may better compensate the threshold voltage of the drive transistor T3.

In some examples, the circuit structures of a plurality of first pixel circuits, a plurality of second pixel circuits, and a plurality of invalid pixel circuits of the first display region may be the same.

In some implementations, taking that the display substrate is applied to wearable electronic products such as watches as an example. A multiplexing circuit (MUX) may be arranged in the peripheral region of the display substrate. A multiplexing circuit may be electrically connected with a plurality of multiplexing control lines and a multiplexing data line. A multiplexing circuit may include a plurality of multiplexing transistors, wherein gates of the plurality of multiplexing transistors may be respectively connected to different multiplexing control lines, first electrodes of the plurality of multiplexing transistors may all be connected to the same multiplexing data line, and second electrodes of the plurality of multiplexing transistors may be respectively connected to different data lines of the display region. By arranging a plurality of multiplexer circuits, one signal source (for example, a pin of the drive chip) may provide data signals for a plurality of data lines, which can greatly reduce the actual quantity of signal sources and simplify the product structure.

Figure 7:
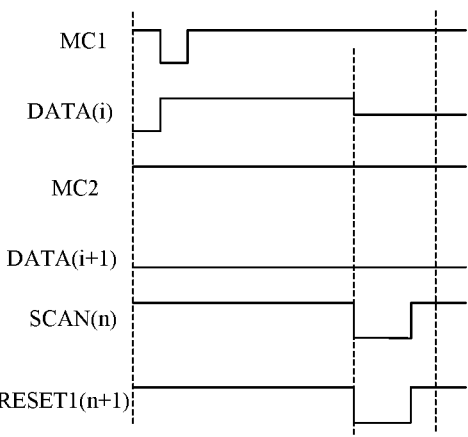
FIG. 7 is a schematic diagram of timing analysis of interference caused by a first reset control signal to a data signal.

FIG. 7 is a schematic diagram of timing analysis of interference caused by a first reset control signal to a data signal. In some examples, as shown in FIG. 7, it is illustrated by taking examples that the multiplexing circuit provides a data signal DATA (i) to the i-th data line under the control of the multiplexing control line MC1, and provides a data signal DATA (i+1) to the (i+1)th data line under the control of the multiplexing control line MC2. In the design of a display substrate of a wearable electronic product, a multiplexing circuit conducts a multiplexing transistor under the control of a multiplexing control signal provided by a multiplexing control line, thereby pre-storing a data signal on the data line. After the multiplexing transistor is turned off, because the data line is in a floating state, the data line is easily disturbed by other signals. According to the working timing of the pixel circuit shown in FIG. 5 and the pixel circuit shown in FIG. 6, a scan signal SCAN (n) of a pixel circuit of an n-th row may be simultaneously used as a first reset control signal RESET1 (n+1) of a pixel circuit of an (n+1)-th row. Therefore, when the pixel circuit of the n-th row performs a data writing, because the pixel circuit of the (n+1)-th row simultaneously performs a reset operation, the first reset control line to which the pixel circuit of the (n+1)-th row is connected will have a signal jump, which will easily cause the adjacent first data transfer line (for example, the i-th data line) to have a signal jump. Because of the parasitic capacitance between the first data transfer line of the first data line and the adjacent first reset control line, it is easy to cause the difference of signal jump variables between the first data line and the second data line, thereby generating poor display in the display region, for example, generating V-shaped illumination similar to the arrangement of the transfer hole.

For the above poor display of the display substrate, the present embodiment provides a display substrate, including a substrate, a plurality of pixel circuits, a plurality of light emitting elements, at least one first reset control line, at least one first data line and at least one first shielding wire. The substrate includes a first display region and a second display region, wherein the first display region at least partially surrounds the second display region. The plurality of pixel circuits are located in the first display region and include a plurality of first pixel circuits and a plurality of second pixel circuits. The plurality of light emitting elements include a plurality of first light emitting elements located in the first display region and a plurality of second light emitting elements located in the second display region. At least one first pixel circuit in the plurality of first pixel circuits is electrically connected with at least one first light emitting element in the plurality of first light emitting elements; and at least one second pixel circuit in the plurality of second pixel circuits is electrically connected with at least one second light emitting element in the plurality of second light emitting elements. The first reset control line is electrically connected to a plurality of pixel circuits arranged along the first direction. The first data line at least includes a first sub-data line, a second sub-data line and a first data transfer line. The first sub-data line is electrically connected to a plurality of pixel circuits in the first display region located on a side of the second display region in the second direction, and the second sub-data line is electrically connected to a plurality of second pixel circuits in the first display region located on a side of the second display region in the first direction. The first data transfer line extends at least along the first direction and electrically connects the first sub-data line and the second sub-data line. The first direction intersects with the second direction. In a direction perpendicular to the display substrate, the first shielding wire is located between the first reset control line and the first data transfer line. At least a portion of the orthographic projection of the first shielding wire on the substrate is located between the orthographic projection of the first data transfer line on the substrate and an orthographic projection of the first reset control line on the substrate.

In some examples, the plurality of pixel circuits to which the first sub-data line is electrically connected may include a plurality of first pixel circuits or may include a plurality of invalid pixel circuits. This embodiment is not limited thereto.

The display substrate provided by an embodiment may reduce the parasitic capacitance between the first data transfer line and the first reset control line by arranging the first shielding wire, and when the first reset control line generates signal jump, the jump of the data signal transmitted by the first data transfer line may be reduced, thereby reducing the differences of the signal jump between the first data line and other data lines, and further improving the poor display in the display region, for example, the poor V-shaped illumination.

In some exemplary implementations, the orthographic projection of the first shielding wire on the substrate may be overlapped with the orthographic projection of the first data transfer line on the substrate. In this example, the shielding effect of the first shielding wire may be improved by arranging an orthographic projection of the first shielding wire on the substrate to be overlapped with an orthographic projection of the first data transfer line on the substrate.

In some exemplary implementations, the first data transfer line may include a main body portion extending along the first direction and a protrusion portion extending from the main body portion in the second direction. The orthographic projection of the first shielding wire on the substrate may at least cover an edge of the main body portion of the first data transfer line close to the first reset control line. For example, an orthographic projection of the main body portion of the first data transfer line on the substrate may be within a range of the orthographic projection of the first shielding wire on the substrate. In other examples, the orthographic projection of the first shielding wire on the substrate may not be overlapped with the orthographic projection of the main body portion of the first data transfer line on the substrate. The signal shielding between the first data transfer line and the first reset control line may be achieved by arranging the first shielding wire to be located on a side of the first data transfer line close to the first reset control line.

In some exemplary implementations, the first data transfer line may be located on a side of the first sub-data line and the second sub-data line away from the substrate. The parasitic capacitance between the first data transfer line and the first reset control line is reduced by increasing the spatial distance between the first data transfer line and the first reset control line and combining the shielding effect of the first shielding wire.

Solutions of the embodiments will be described below through some examples.

Figure 8:
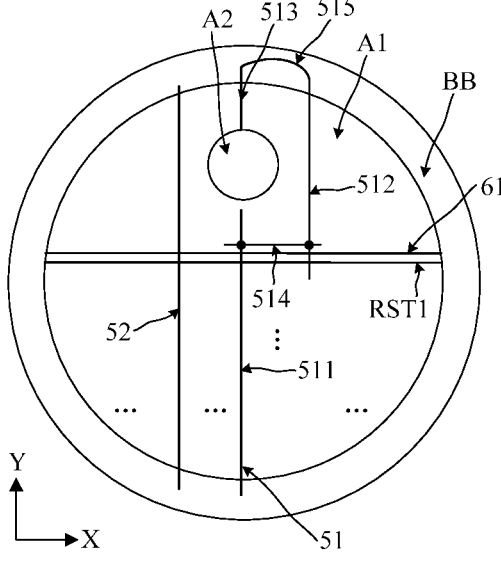
FIG. 8 is a schematic diagram of a display substrate according to at least one embodiment of the present disclosure.

FIG. 8 is a schematic diagram of a display substrate according to at least one embodiment of the present disclosure. In FIG. 8, it is illustrated by taking only one first data line 51 and one second data line 52 as examples. In some examples, as shown in FIG. 8, the first data line 51 may include a first sub-data line 511, a first data transfer line 514 and a second sub-data line 512. The first sub-data line 511 and the second sub-data line 512 may be electrically connected through the first transfer line 514. The first data line 51 may include a third sub-data line 513, and the third sub-data line 513 and the second sub-data line 512 may be electrically connected through a second data transfer line 515 located in the peripheral region BB. An extension direction of the first shielding wire 61 and an extension direction of the first data transfer line 514 may be substantially the same, for example, both extend along the first direction X. A length of the first shielding wire 61 along the first direction X may be greater than or equal to a length of the first data transfer line 514 along the first direction X. A spatial position of the first shielding wire 61 in the display substrate may be located between the first data transfer line 514 and the first reset control line RST1, which may be, for example, on a side of the first data transfer line 514 close to the substrate and located on a side of the first reset control line RST1 away from the substrate, thereby achieving a shielding effect between the first data transfer line 514 and the first reset control line RST1, and reducing parasitic capacitance between the first data transfer line 514 and the first reset control line RST1.

In some examples, the equivalent circuits of the first pixel circuit and the second pixel circuit of the first display region may be different. For example, the equivalent circuit of the first pixel circuit may be as shown in FIG. 5. The equivalent circuit of the invalid pixel circuit and the equivalent circuit of the second pixel circuit may be the same, and the invalid pixel circuit is not electrically connected to any light emitting element.

Figure 9:
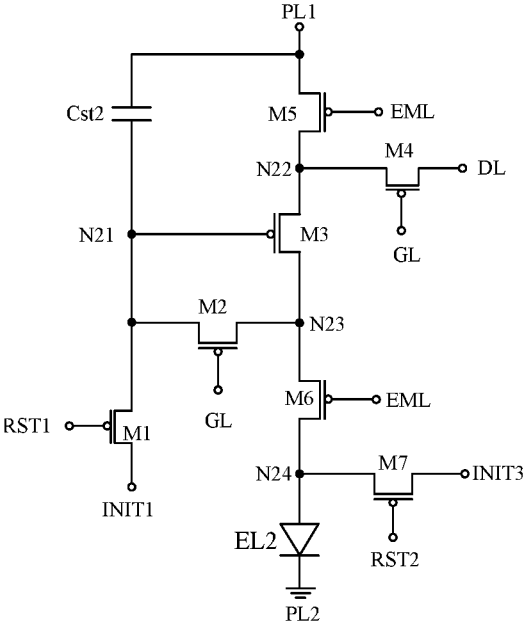
FIG. 9 is an equivalent circuit diagram of a second pixel circuit according to at least one embodiment of the present disclosure.

FIG. 9 is an equivalent circuit diagram of a second pixel circuit according to at least one embodiment of the present disclosure. In some examples, as shown in FIG. 9, the equivalent circuit of the second pixel circuit may include six switching transistors (M1, M2, and M4 to M7), one drive transistor M3, and one second storage capacitor Cst2. The six switching transistors may be respectively a data writing transistor M4, a threshold compensation transistor M2, a first light emitting control transistor M5, a second light emitting control transistor M6, a first reset transistor M1, and a second reset transistor M7. The second reset transistor M7 may also be referred to as an anode reset transistor. The second pixel circuit is electrically connected to a second light emitting element EL2, which may include an anode, a cathode, and an organic light emitting layer arranged between the anode and the cathode.

In this example, a first node N21 is a connection point of the second storage capacitor Cst2, the first reset transistor M1, the drive transistor M3, and the threshold compensation transistor M2, a second node N22 is a connection point of the first light emitting control transistor M5, the data writing transistor M4, and the drive transistor M3, a third node N23 is a connection point of the drive transistor M3, the threshold compensation transistor M2, and the second light emitting control transistor M6, and a fourth node N24 is a connection point of the second light emitting control transistor M6, the second reset transistor M7, and the second light emitting element EL2. The fourth node N24 may also be referred to as an anode connection node.

In some examples, the second pixel circuit differs from the first pixel circuit in that a first electrode of the second reset transistor M7 of the second pixel circuit is electrically connected to the third initial signal line INIT3, and a first electrode of the second reset transistor T7 of the first pixel circuit is electrically connected to the second initial signal line INIT2. The third initial signal provided by the third initial signal line INIT3 may be greater than the second initial signal provided by the second initial signal line INIT2. By setting a voltage of the anode connection node of the second pixel circuit at the time of reset to be greater than a voltage of the anode connection node of the first pixel circuit at the time of reset, the time required for the anode of the second light emitting element EL2 to reach the light emitting threshold voltage may be reduced, the light emitting time of the second light emitting element may be increased, the influence of the capacitance generated by the overlapping of the conductive line L and other film layers on the illumination turned-on time lengths of the second light emitting element may be improved, and the situation that the second display region is dark compared with the first display region may be avoided, thereby improving the display effect of the display substrate.

In some examples, the working timing of the second pixel circuit and the working timing of the first pixel circuit as shown in FIG. 5 may be substantially the same, and therefore will not be repeated here.

Figure 10A:
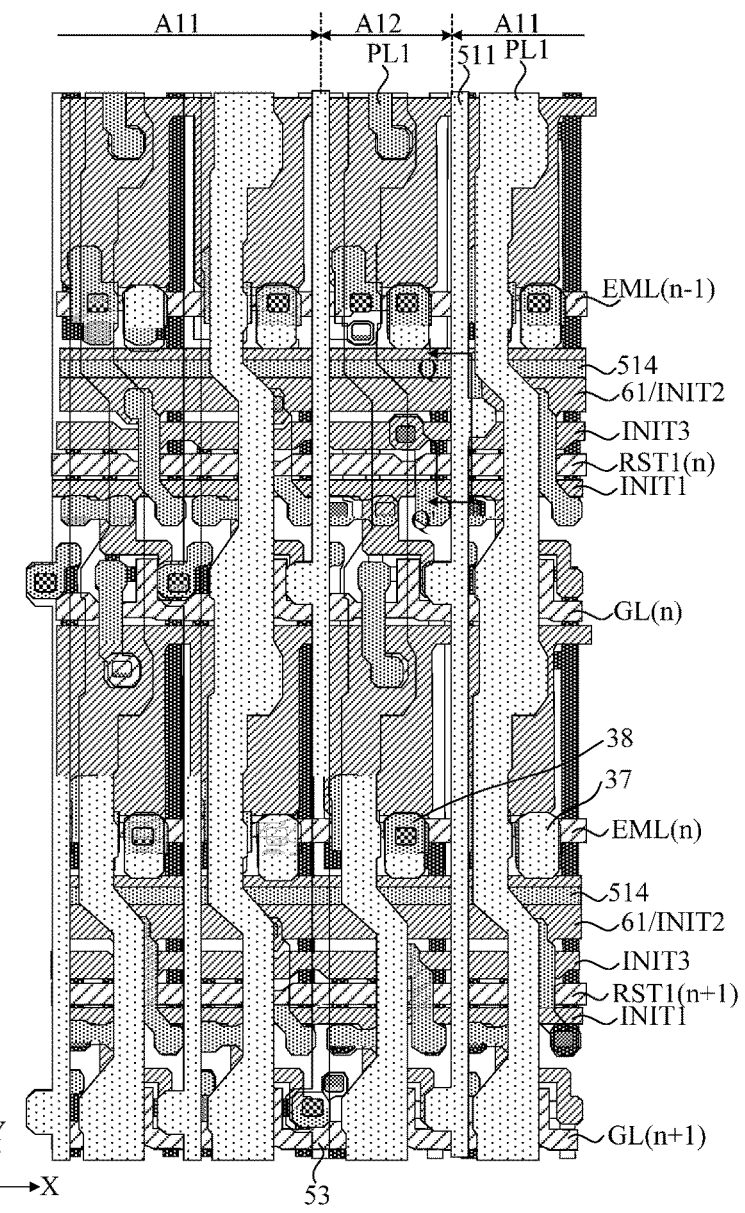
FIG. 10A is a partial plan schematic diagram of a first display region according to at least one embodiment of the present disclosure.
Figure 10B:
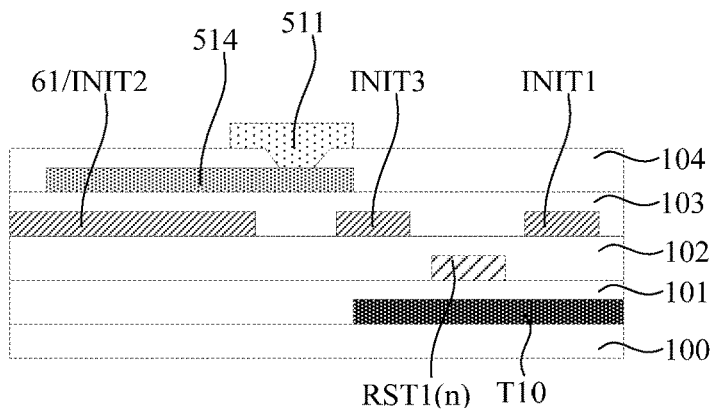
FIG. 10B is a partial sectional schematic diagram along a Q-Q′ direction in FIG. 10A.

FIG. 10A is a partial plan schematic diagram of a first display region according to at least one embodiment of the present disclosure. FIG. 10B is a partial sectional schematic diagram along a Q-Q' direction in FIG. 10A.

In some examples, as shown in FIG. 10A, the first display region may include a first circuit region A11 and a second circuit region A12 arranged at intervals in the first direction X. The first circuit region A11 may be provided with a plurality of columns of first pixel circuits (e.g. three columns of first pixel circuits), and the second circuit region A12 may be provided with a column of pixel circuits (e.g. including at least one second pixel circuit and a plurality of invalid pixel circuits, or may include a plurality of invalid pixel circuits). In this example, it is illustrated by taking the first pixel drive circuit of the first circuit region A11 and the invalid pixel circuit of the second circuit region A12 as an example.

In some examples, as shown in FIG. 10B, in a direction perpendicular to the display substrate, the first display region may include a substrate 100, and a circuit structure layer and a light emitting structure layer which are arranged sequentially on the substrate 100. The light emitting structure layer of the first display region may include a plurality of first light emitting elements, and the light emitting structure layer of the second display region may include a plurality of second light emitting elements. The circuit structure layer of the first display region may include a semiconductor layer, a first conductive layer, a second conductive layer, a third conductive layer, and a fourth conductive layer which are arranged sequentially on the substrate 100. A first insulation layer 101 may be arranged between the semiconductor layer and the first conductive layer, a second insulation layer 102 may be arranged between the first conductive layer and the second conductive layer, a third insulation layer 103 may be arranged between the second conductive layer and the third conductive layer, and a fourth insulation layer 104 may be arranged between the third conductive layer and the fourth conductive layer. The first conductive layer may also be referred to as a first gate metal layer, the second conductive layer may also be referred to as a second gate metal layer, the third conductive layer may also be referred to as a first source-drain metal layer, and the fourth conductive layer may also be referred to as a second source-drain metal layer.

In some examples, the first insulation layer 101 to the fourth insulation layer 104 may all be inorganic insulation layers. However, this embodiment is not limited thereto. For example, the fourth insulation 104 layer may be an organic insulation layer.

Figure 11A:
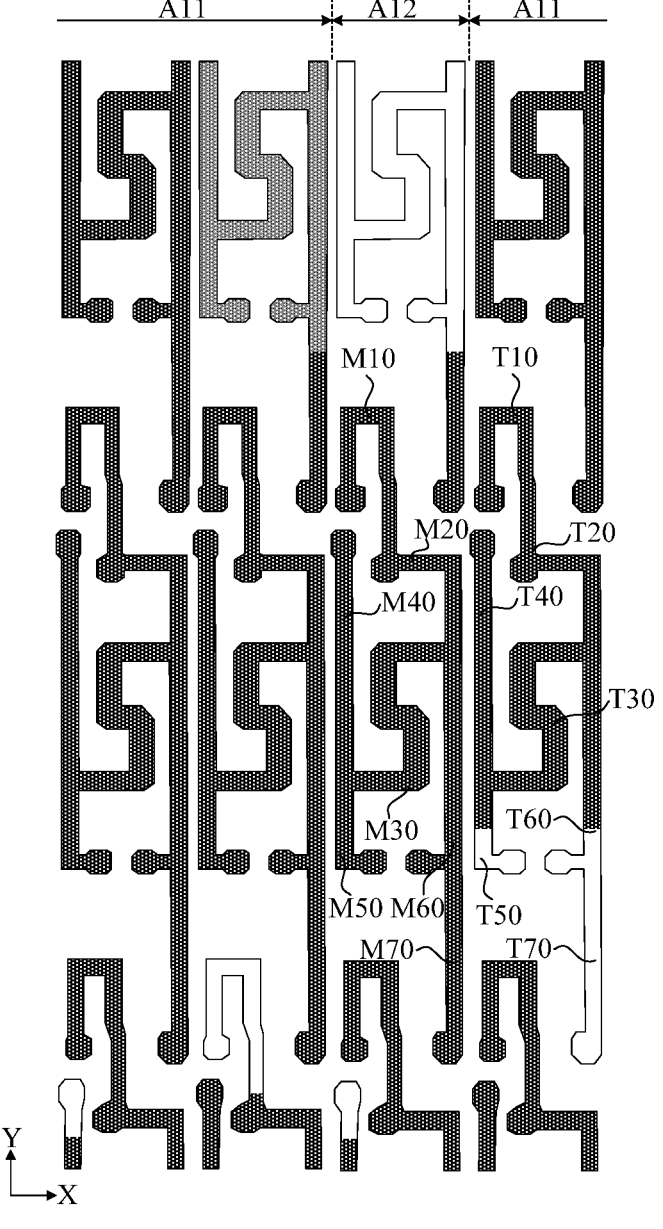
FIG. 11A is a partial plan schematic diagram of a first display region after a semiconductor layer is formed in FIG. 10A.

FIG. 11A is a partial plan schematic diagram of a first display region after a semiconductor layer is formed in FIG. 10A. In some examples, as shown in FIG. 11A, the semiconductor layer of the first display region may at least include active layers of a plurality of transistors of the first pixel circuit (e.g., including an active layer T10 of the first reset transistor T1, an active layer T20 of the threshold compensation transistor T2, an active layer T30 of the drive transistor T3, an active layer T40 of the data writing transistor T4, an active layer T50 of the first light emitting control transistor T5, an active layer T60 of the second light emitting control transistor T6, and an active layer T70 of the second reset transistor T7), and active layers of a plurality of transistors of the invalid pixel circuit (e.g., including an active layer M10 of the first reset transistor M1, an active layer M20 of the threshold compensation transistor M2, an active layer M30 of the drive transistor M3, an active layer M40 of the data writing transistor M4, an active layer M50 of the first light emitting control transistor M5, an active layer M60 of the second light emitting control transistor M6 and an active layer M70 of the second reset transistor M7).

In some examples, as shown in FIG. 11A, active layers of the seven transistors of the first pixel circuit may be of an integral structure, and active layers of the seven transistors of the invalid pixel circuit may be of an integral structure. A shape of the active layer T10 of the first reset transistor T1 of the first pixel circuit may be substantially n-shaped, a shape of the active layer T20 of the threshold compensation transistor T2 may be substantially L-shaped, a shape of the active layer T30 of the drive transistor T3 may be substantially S-shaped, shapes of the active layer T40 of the data writing transistor T4 and the active layer T70 of the second reset transistor T7 may be substantially I-shaped, and shapes of the active layer T50 of the first light emitting control transistor T5 and the active layer T60 of the second light emitting control transistor T6 may be substantially L-shaped. The shapes of the active layers of the seven transistors of the invalid pixel circuit are similar to the shapes of the active layers of the seven transistors of the first pixel circuit, and will not be repeated here.

Figure 11B:
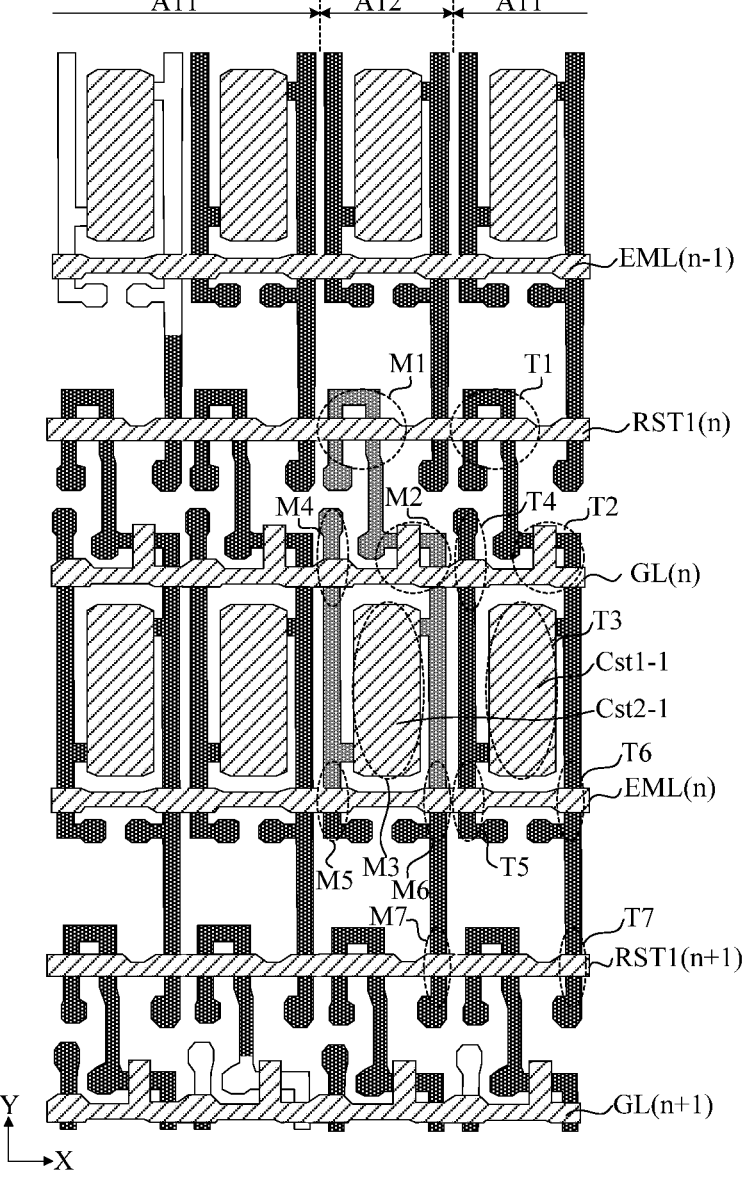
FIG. 11B is a partial plan schematic diagram of a first display region after a first conductive layer is formed in FIG. 10A.

FIG. 11B is a partial plan schematic diagram of a first display region after a first conductive layer is formed in FIG. 10A. In some examples, as shown in FIG. 11B, the first conductive layer of the first display region may at least include gates of a plurality of transistors of the first pixel circuit (e.g. including: a gate of the first reset transistor T1, a gate of the threshold compensation transistor T2, a gate of the drive transistor T3, a gate of the data writing transistor T4, a gate of the first light emitting control transistor T5, a gate of the second light emitting control transistor T6 and a gate of the second reset transistor T7 of the first pixel circuit), a first electrode plate Cst1-1 of the first storage capacitor Cst1, gates of a plurality of transistors of the invalid pixel circuit (e.g. including: a gate of the first reset transistor M1, a gate of the threshold compensation transistor M2, a gate of the drive transistor M3, a gate of the data writing transistor, a gate of the first light emitting control transistor M5, a gate of the second light emitting control transistor M6 and a gate of the second reset transistor M7 of the invalid pixel circuit) and a first electrode plate Cst2-1 of the second storage capacitor Cst2.

In some examples, as shown in FIG. 11B, the first conductive layer of the first display region may further include scan lines GL (n) and GL (n+1), first reset control lines RST1 (*n*) and RST1 (n+1) and light emitting control lines EML (n) and EML (n-1) which extend along the first direction X. The first reset control line RST1 (*n*) may be located on a side of the scan line GL (n) away from the first electrode plate of the storage capacitor in the second direction Y. The scan line GL (n) may be located between the first reset control line RST1 (*n*) and the light emitting control line EML (n) in the second direction Y.

In some examples, as shown in FIG. 11B, the first electrode plate Cst1-1 of the first storage capacitor Cst1 of the first pixel circuit may be in a shape of a rectangle, corners of which may be provided with chamfers. An orthographic projection of the first electrode plate Cst1-1 of the first storage capacitor Cst1 on the substrate is overlapped with an orthographic projection of the active layer T30 of the drive transistor T3 on the substrate. The first electrode plate Cst1-1 of the first storage capacitor Cst1 and the gate of the drive transistor T3 may be of an integral structure, and the first electrode plate Cst1-1 of the first storage capacitor Cst1 may simultaneously serve as the gate of the drive transistor T3. The first electrode plate Cst2-1 of the second storage capacitor Cst2 of the invalid pixel circuit and the gate of the drive transistor M3 may be of an integral structure, and the first electrode plate Cst2-1 of the second storage capacitor Cst2 may simultaneously serve as the gate of the drive transistor M3.

In some examples, as shown in FIG. 11B, the scan line GL (n), the gates of the threshold compensation transistor T2 and the data writing transistor T4 of the first pixel circuit, and the gates of the threshold compensation transistor M2 and the data writing transistor M4 of the invalid pixel circuit located in the same row as the first pixel circuit may be of an integral structure. The first reset control line RST1 (n), a gate of the first reset transistor T1 of the first pixel circuit, a gate of the first reset transistor M1 of the invalid pixel circuit located in the same row as the first pixel circuit, a gate of the second reset transistor T7 of the first pixel circuit located in the previous row of the first pixel circuit, and a gate of the second reset transistor M7 of the invalid pixel circuit located in the previous row of the first pixel circuit may be of an integral structure. The first reset control line RST1 (n+1), a gate of the second reset transistor T7 of the first pixel circuit, a gate of the second reset transistor M7 of the invalid pixel circuit located in the same row as the first pixel circuit, a gate of the first reset transistor T1 of the first pixel circuit located in the next row of the first pixel circuit, and a gate of the first reset transistor M1 of the invalid pixel circuit located in the next row of the first pixel circuit may be of an integral structure. The light emitting control line EML (n), gates of the first light emitting control transistor T5 and the second light emitting control transistor T6 of the first pixel circuit, and gates of the first light emitting control transistor M5 and the second light emitting control transistor M6 of the invalid pixel circuit in the same row as the first pixel circuit may be of an integral structure.

Figure 11C:
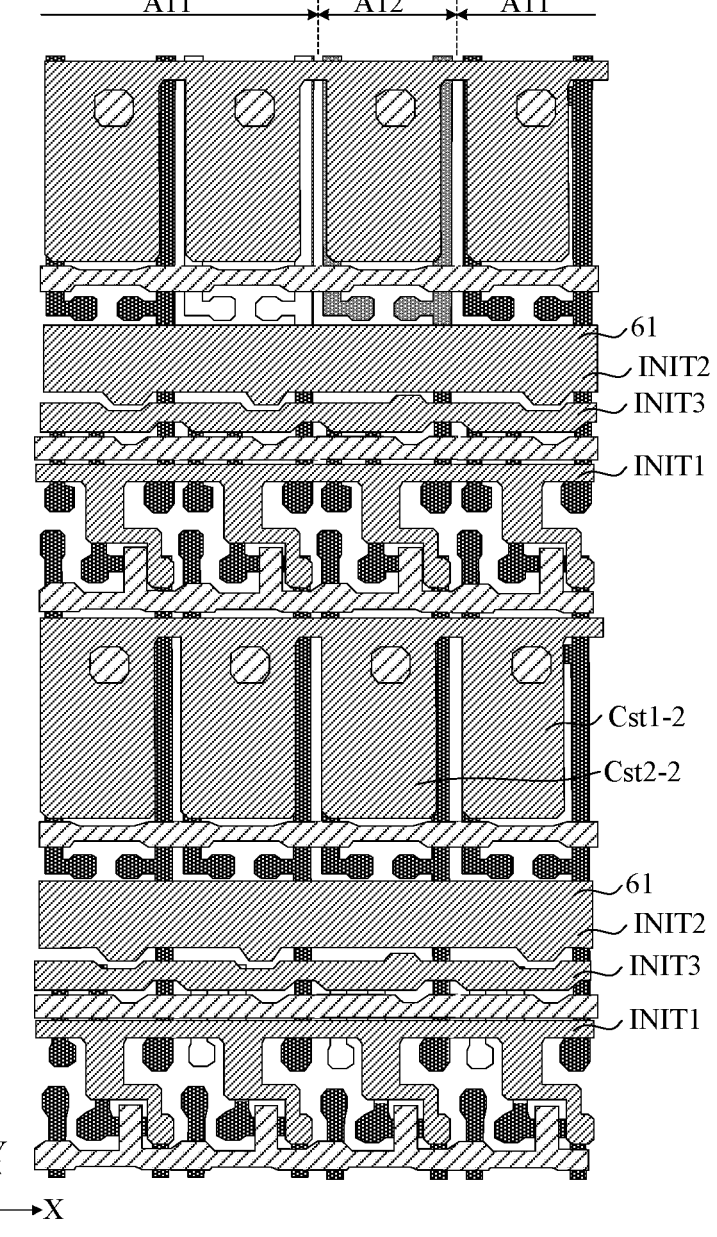
FIG. 11C is a partial plan schematic diagram of a first display region after a second conductive layer is formed in FIG. 10A.

FIG. 11C is a partial plan schematic diagram of a first display region after a second conductive layer is formed in FIG. 10A In some examples, as shown in FIG. 11C, the second conductive layer of the first display region at least includes a second electrode plate Cst1-2 of the first storage capacitance Cst1 of the first pixel circuit, a second electrode plate Cst2-2 of the second storage capacitance Cst2 of the invalid pixel circuit, a plurality of first initial signal lines INIT1, a plurality of second initial signal lines INIT2, a plurality of third initial signal lines INIT3, and a plurality of first shielding wires 61. The first initial signal line INIT1, the second initial signal line INIT2, the third initial signal line INIT3, and the first shielding wire 61 may all extend along the first direction X. An orthographic projection of the third initial signal line INIT3 on the substrate may be located between an orthographic projection of the first initial signal line INIT1 and an orthographic projection of the second initial signal line INIT2 on the substrate. The first shielding wire 61 may be located on a side of the second initial signal line INIT2 away from the third initial signal line INIT3. The first shielding wire 61 and the second initial signal line INIT2 may be of an integral structure. For example, a length of the integral structure of the first shielding wire 61 and the second initial signal line INIT2 along the second direction Y may be greater than a length of the third initial signal line INIT3 and the first initial signal line INIT1 along the second direction Y. In some examples, a length of the integral structure of the first shielding wire 61 and the second initial signal line INIT2 along the second direction Y may be greater than a length of the separately arranged second initial signal line INIT2 along the second direction Y. For example, the length of the integral structure of the first shielding wire 61 and the second initial signal line INIT2 along the second direction Y may be greater than or equal to 1.5 times the length of the separately arranged second initial signal lines INIT2 along the second direction Y, which may be, for example, about 2 times. For example, the length of the separately arranged second initial signal line INIT2 along the second direction Y may be substantially the same as a length of the third initial signal line INIT3 along the second direction Y. An orthographic projection of the first reset control line RST1 (n) on the substrate may be located between an orthographic projection of the third initial signal line INIT3 on the substrate and an orthographic projection of the first initial signal line INIT1 on the substrate. In some examples, the length of the first shielding wire 61 along the first direction X may be greater than or equal to a length of the corresponding first data transfer line along the first direction X.

In some examples, as shown in FIG. 11C, the second electrode plate Cst1-2 of the first storage capacitor Cst1 of the first pixel circuit and the second electrode plate Cst2-2 of the second storage capacitor Cst2 of the invalid pixel circuit in the same row as the first pixel circuit may be of an integral structure to achieve the transmission of the first voltage signal along the first direction X, thereby improving the uniformity of the first voltage signal within the display substrate.

Figure 11D:
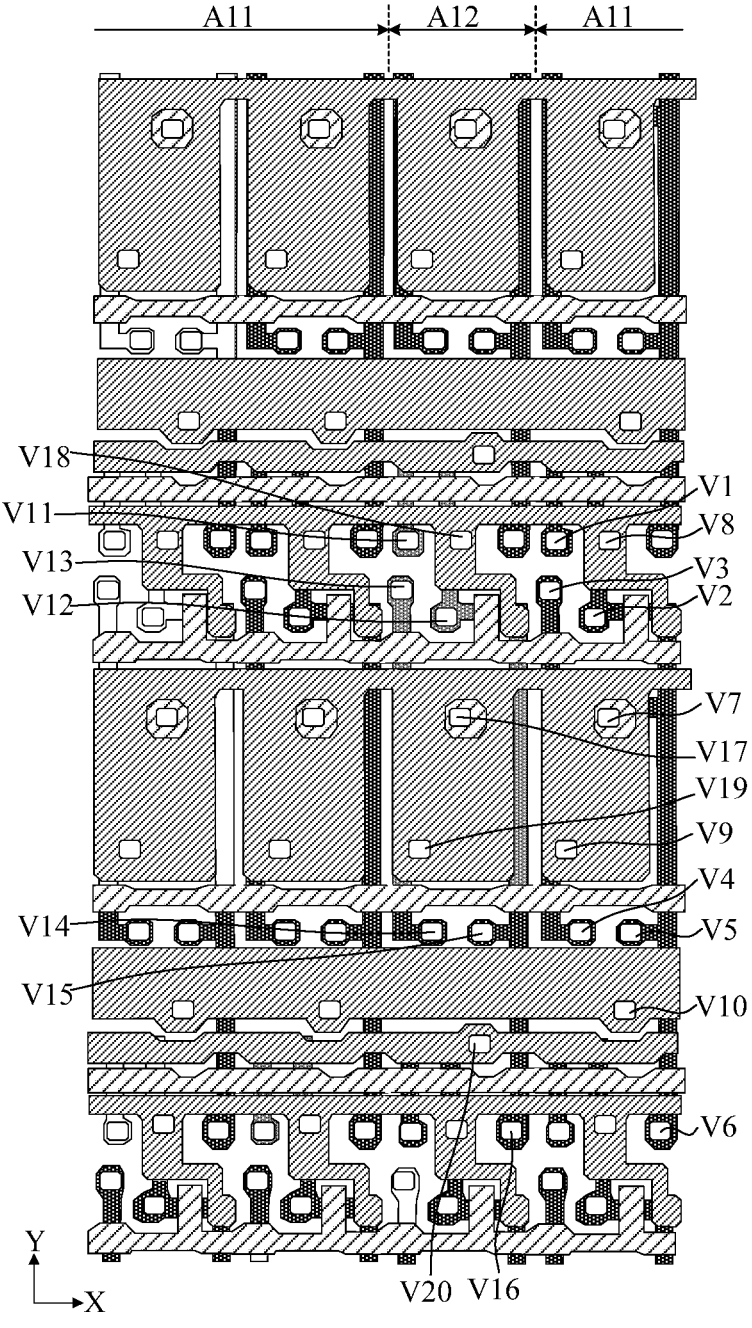
FIG. 11D is a partial plan schematic diagram of a first display region after a third insulation layer is formed in FIG. 10A.

FIG. 11D is a partial plan schematic diagram of a first display region after a third insulation layer is formed in FIG. 10A. In some examples, as shown in FIG. 11D, the third insulation layer of the first display region may be provided with a plurality of via holes, which may include, for example, a first via hole V1 to a twentieth via hole V20. The third insulation layer, the second insulation layer, and the first insulation layer within the first via hole V1 to the sixth via hole V6 and the eleventh via hole V11 to the sixteenth via hole V16 may be removed to expose a portion of a surface of the semiconductor layer. The third insulation layer and the second insulation layer within the seventh via hole V7 and the seventeenth via hole V17 may be removed to expose a portion of a surface of the first conductive layer. The third insulation layer within the eighth via hole V8 to the tenth via hole V10 and the eighteenth via hole V18 to the twentieth via hole V20 may be removed to expose a portion of a surface of the second conductive layer.

Figure 11E:
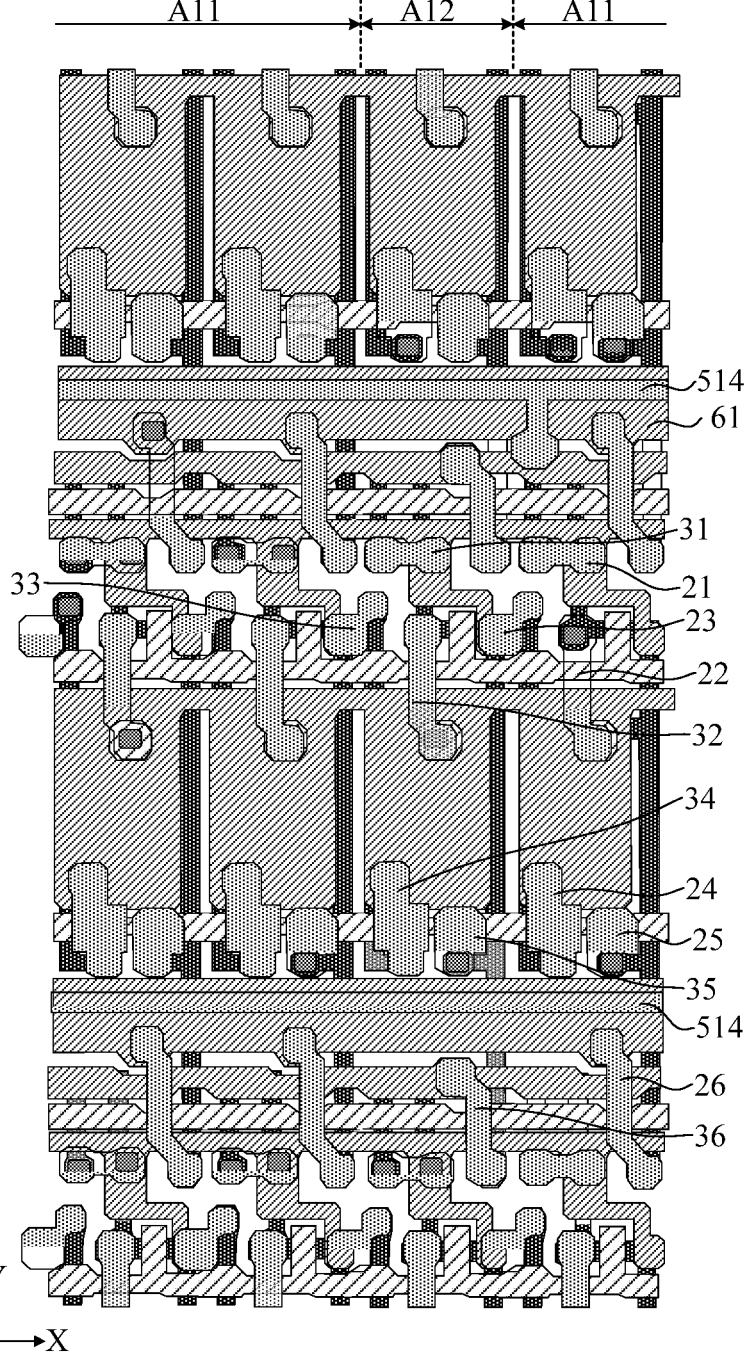
FIG. 11E is a partial plan schematic diagram of a first display region after the third conductive layer is formed in FIG. 10A.
Figure 11F:
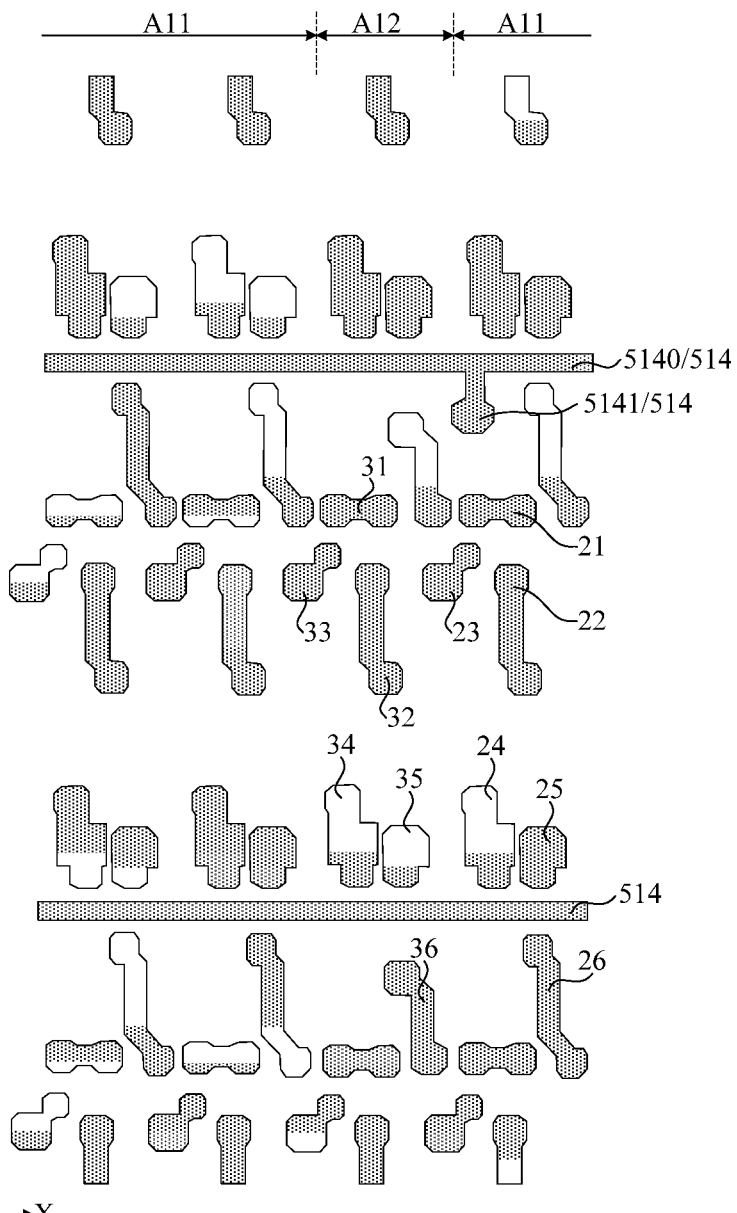
FIG. 11F is a plan schematic diagram of a third conductive layer in FIG. 11E.

FIG. 11E is a partial plan schematic diagram of a first display region after the third conductive layer is formed in FIG. 10A. FIG. 11F is a plan schematic diagram of a third conductive layer in FIG. 11E. In some examples, as shown in FIG. 11E and FIG. 11F, the third conductive layer of the first display region may include a plurality of connection electrodes (e.g. Including a first connection electrode 21 to a sixth connection electrode 26, an eleventh connection electrode 31 to a sixteenth connection electrode 36), and a first data transfer line 514. The first data transfer line 514 may extend at least along the first direction X. One first data transfer line 514 may be located between two adjacent rows of pixel circuits.

In some examples, as shown in FIG. 11F, the first data transfer line 514 may include a main body portion 5140 extending along the first direction X and a protrusion portion 5141 extending from the main body portion 5140 in the second direction Y. The protrusion portion 5141 may be located on a side of the main body portion 5140 close to the first reset control line. However, this embodiment is not limited thereto. For example, the protrusion portion 5141 may be located on a side of the main body portion away from the first reset control line.

In some examples, as shown in FIG. 11E and FIG. 11F, an orthographic projection of the main body portion 5140 of the first data transfer line 514 on the substrate may be within a range of an orthographic projection of the first shielding wire 61 on the substrate. The orthographic projection of the first shielding wire 61 on the substrate may cover edges of both sides of the main body portion 5140 of the first data transfer line 514 in the second direction Y and is partially overlapped with an orthographic projection portion of the protrusion portion 5141 on the substrate. In this example, by arranging the first shielding wire 61, a shielding effect may be achieved between the first data transfer line 514 and the first reset control line RST1, thereby reducing the parasitic capacitance between the first data transfer line and the first reset control line.

In some examples, as shown in FIG. 11A to FIG. 11F, the first connection electrode 21 may be electrically connected with an active layer T10 of the first reset transistor T1 of the first pixel circuit through the first via hole V1, and may be electrically connected with the first initial signal line INIT1 through the eighth via hole V8. The second connection electrode 22 may be electrically connected with an active layer T20 of the threshold compensation transistor T2 of the first pixel circuit through the second via hole V2, and may be electrically connected with a gate of the drive transistor T3 through the seventh via hole V7. The third connection electrode 23 may be electrically connected to the active layer T40 of the data writing transistor T4 through the third via hole V3. The fourth connection electrode 24 may be electrically connected to an active layer T50 of the first light emitting control transistor T5 through the fourth via hole V4, and may be electrically connected to an second electrode plate Cst1-2 of the first storage capacitor Cst1 through the ninth via hole V9. The fifth connection electrode 25 may be electrically connected to an active layer T60 of the second light emitting control transistor T6 through the fifth via hole V5. The sixth connection electrode 26 may be electrically connected to an active layer T70 of the second reset control transistor T7 through the sixth via hole V6, and may be electrically connected to the second initial signal line INIT2 through the tenth via hole V10.

In some examples, as shown in FIG. 11A to FIG. 11F, the eleventh connection electrode 31 may be electrically connected with an active layer M10 of the first reset transistor M1 of the invalid pixel circuit through the eleventh via hole V11, and may be electrically connected with the first initial signal line INIT1 through the eighteenth via hole V18. The twelfth connection electrode 32 may be electrically connected with an active layer M20 of the threshold compensation transistor M2 through the twelfth via hole V12, and may be electrically connected with a gate of the drive transistor M3 through the seventeenth via hole V17. The thirteenth connection electrode 33 may be electrically connected to an active layer M40 of the data writing transistor M4 through the thirteenth via hole V13. The fourteenth connection electrode 34 may be electrically connected with an fifth active layer M50 of the first light emitting control transistor M5 through the fourteenth via hole V14, and may be electrically connected with a second electrode plate Cst2-2 of the second storage capacitor Cst2 through the nineteenth via hole V19. The fifteenth connection electrode

35 may be electrically connected with an active layer M60 of the second light emitting control transistor M6 through the fifteenth via hole V15. The sixteenth connection electrode 36 may be electrically connected to an active layer M70 of the second reset control transistor M7 through the sixteenth via hole V16, and may be electrically connected to the second initial signal line INIT2 through the twentieth via hole V20.

Figure 11G:
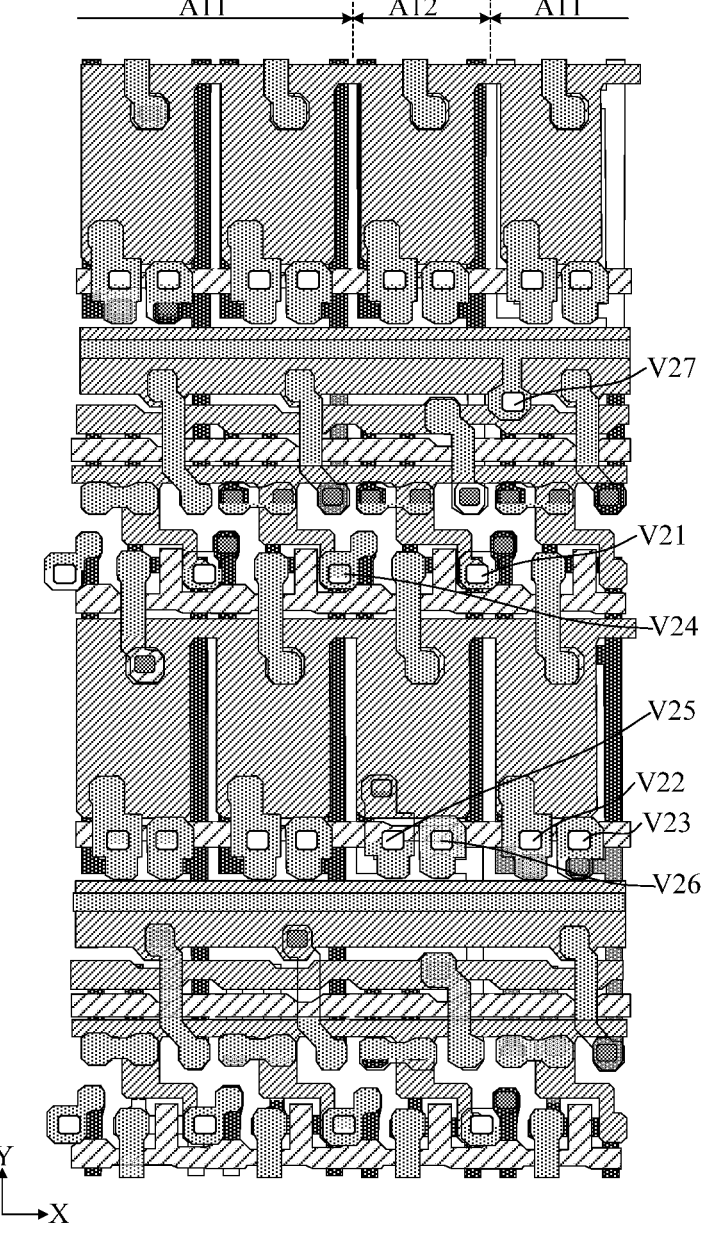
FIG. 11G is a partial plan schematic diagram of a first display region after a fourth insulation layer is formed in FIG. 10A.

FIG. 11G is a partial plan schematic diagram of a first display region after a fourth insulation layer is formed in FIG. 10A. In some examples, as shown in FIG. 11G, the fourth insulation layer of the first display region may be provided with a plurality of via holes, which may include, for example, a twenty-first via hole V21 to a twenty-sixth via hole V26, and a transfer hole V27. The fourth insulation layer within the twenty-first via hole V21 to the twenty-sixth via hole V26 and the transfer hole 27 may be removed to expose a portion of a surface of the third conductive layer.

In some examples, as shown in FIG. 10A, the fourth conductive layer of the first display region may at least include a plurality of first power supply lines PL1, a first sub-data line 511 and a second sub-data line (not shown) of the first data line, a third data line 53, and a plurality of connection electrodes (including, for example, a seventeenth connection electrode 37 and an eighteenth connection electrode 38). The first sub-data line 511, the first power supply line PL1, and the third data line 53 may extend along the second direction Y.

In some examples, as shown in FIG. 10A to FIG. 11G, the first sub-data line 511 may be electrically connected to the third connection electrode 23 through the twenty-first via hole V21 to achieve an electrical connection to the data writing transistor T4 of the first pixel circuit, and the first sub-data line 511 may be electrically connected to the first data transfer line 514 through the transfer hole V27. The third data line 53 may be electrically connected to the thirteenth connection electrode 33 through the twenty-fourth via hole V24 to achieve an electrical connection to the data writing transistor M4 of the invalid pixel circuit. The third data line 53 does not need to wind in the first display region. The first power supply line PL1 of the first circuit region A11 may be electrically connected to the fourth connection electrode 24 through the twenty-second via hole V22 to achieve an electrical connection to the first light emitting control transistor T5 and the first storage capacitor Cst1 of the first pixel circuit. The first power supply line PL1 of the second circuit region A12 may be electrically connected to the fourteenth connection electrode 34 through the twenty-fifth via hole V25 to achieve an electrical connection to the first light emitting control transistor M5 and the second storage capacitor Cst2 of the invalid pixel circuit. The seventeenth connection electrode 37 may be electrically connected to the fifth connection electrode 25 through the twenty-third via hole V23 to achieve an electrical connection to the second light emitting control transistor T6 of the first pixel circuit, and the seventeenth connection electrode 37 may subsequently be electrically connected to the anode of the first light emitting element. The eighteenth connection electrode 38 may be electrically connected to the fifteenth connection electrode 35 through the twenty-sixth via hole V26 to achieve an electrical connection to the second light emitting control transistor M6 of the invalid pixel circuit, and the eighteenth connection electrode 38 does not need to be subsequently electrically connected to the anode of the light emitting element.

Exemplary description is made below for a preparation process of a display substrate. A "patterning process" mentioned in the embodiments of the present disclosure includes a treatment such as photoresist coating, mask exposure, development, etching, and photoresist stripping for a metal material, an inorganic material, or a transparent conductive material, and includes a treatment such as organic material coating, mask exposure, and development for an organic material. Deposition may be any one or more of sputtering, evaporation and chemical vapor deposition, coating may be any one or more of spray coating, spin coating and inkjet printing, and etching may be any one or more of dry etching and wet etching, the present disclosure is not limited thereto. A "thin film" refers to a layer of thin film made of a material on a base substrate by using deposition, coating, or other processes. If the "thin film" does not need to be processed through a patterning process in the entire manufacturing process, the "thin film" may also be called a "layer". If the "thin film" needs to be processed through the patterning process in the entire manufacturing process, the "thin film" is called a "thin film" before the patterning process is performed and is called a "layer" after the patterning process is performed. At least one "pattern" is contained in the "layer" which has been processed through the patterning process.

"A and B have a same layer structure" or "A and B are disposed in a same layer" mentioned in the embodiments of the present disclosure means that A and B are formed simultaneously through a same patterning process, or surfaces of A and B close to a base substrate have basically a same distance from the base substrate, or the surfaces of A and B close to the base substrate are in direct contact with a same film layer. A "thickness" of a film layer is a dimension of the film layer in a direction perpendicular to the display substrate. In the exemplary embodiment of the present disclosure, "an orthographic projection of B being within the range of an orthographic projection of A" or "an orthographic projection of A containing an orthographic projection of B" means that the boundary of the orthographic projection of B falls within the range of the boundary of the orthographic projection of A, or the boundary of the orthographic projection of A is overlapped with the boundary of the orthographic projection of B.

In some exemplary implementations, the preparation process of the display substrate may include following operations.

(1) a substrate is provided. In some examples, the substrate may be a flexible base substrate or may be a rigid base substrate. For example, the rigid base substrate may be made of a material such as glass or quartz. The flexible base substrate may be made of Polyimide (PI) or another material, and the flexible base substrate may be of a single-layer structure or a laminated structure formed by an inorganic material layer and a flexible material layer. However, this embodiment is not limited thereto.

(2) A semiconductor layer is formed. In some examples, a semiconductor thin film is deposited on the substrate, and the semiconductor thin film is patterned through a patterning process to form a semiconductor layer in the first display region, as shown in FIG. 11A. Active layers of seven transistors of one pixel circuit may be in an integral structure in which the active layers are connected with each other.

In some examples, a material of the semiconductor layer, for example, may include poly-silicon. An active layer may include at least one channel region and a plurality of doped regions. The channel region may not be doped with an impurity, and has characteristics of a semiconductor. The plurality of doped regions may be located at two sides of the channel region and doped with impurities, and thus have conductivity. The impurities may be varied according to types of transistors. In some examples, a doped region of the active layer may be interpreted as a source or a drain of a transistor. A part of the active layer between the transistors may be interpreted as a wiring doped with an impurity, and may be used for electrically connection between the transistors.

(3) A first conductive layer is formed. In some examples, a first insulation thin film and a first conductive thin film are sequentially deposited on the substrate where the aforementioned structures are formed, and the first conductive thin film is patterned through a patterning process to form a first insulation layer covering the semiconductor layer, and a first conductive layer arranged on the first insulation layer in the first display region, as shown in FIG. 11B.

(4) A second conductive layer is formed. In some examples, a second insulation thin film and a second conductive thin film are sequentially deposited on the substrate where the aforementioned structures are formed, and the second conductive thin film is patterned through a patterning process to form a second insulation layer covering the first conductive layer, and a second conductive layer arranged on the second insulation layer in the first display region, as shown in FIG. 11C.

(5) A third insulation layer is formed. In some examples, a third insulation thin film is deposited on the substrate on which the aforementioned patterns are formed, and the third insulation thin film is patterned through a patterning process to form a third insulation layer, as shown in FIG. 11D.

(6) A third conductive layer is formed. In some examples, a third conductive thin film is deposited on the substrate where the aforementioned patterns are formed, and the third conductive thin film is patterned through a patterning process to form a third conductive layer on the third insulation layer in the first display region, as shown in FIG. 11E and FIG. 11F.

(7) A fourth insulation layer is formed. In some examples, a fourth insulation thin film is deposited on the substrate on which the aforementioned patterns are formed, and the fourth insulation thin film is patterned through a patterning process to form the fourth insulation layer, as shown in FIG. 11G.

(8) A fourth conductive layer is formed. In some examples, a fourth conductive thin film is deposited on the substrate on which the aforementioned patterns are formed, and the fourth conductive thin film is patterned through a patterning process to form a fourth conductive layer on the fourth insulation layer in the first display region, as shown in FIG. 10A.

So far, the manufacturing of the circuit structure layer of the first display region A1 is completed. The second display region A2 may include: a substrate, a first insulation layer, the second insulation layer, the third insulation layer, and the fourth insulation layer that are stacked on the substrate.

(9) A first planarization layer, a transparent conductive layer, a second planarization layer, an anode layer, a pixel definition layer, an organic light emitting layer, and a cathode layer are formed sequentially.

In some examples, a first planarization thin film is coated on the substrate on which the aforementioned patterns are formed, and the first planarization thin film is patterned through a patterning process to form a first planarization layer. The first planarization layer may be provided with a plurality of first pixel connection holes and a plurality of second pixel connection holes. The first planarization layer within the first pixel connection hole is removed, which may expose a first pixel connection electrode of the first pixel circuit, and the first planarization layer within the second pixel connection hole is removed, which may expose a second pixel connection electrode of the second pixel circuit. Subsequently, a transparent conductive thin film is deposited on the substrate on which the aforementioned patterns are formed, and the transparent conductive thin film is patterned through a patterning process to form a transparent conductive layer. The transparent conductive layer may include a transparent conductive line electrically connecting with a second pixel circuit and a second light emitting element. Subsequently, a second planarization thin film is coated on the substrate on which the aforementioned patterns are formed, and the second planarization thin film is patterned through a patterning process to form a second planarization layer. Subsequently, an anode thin film is deposited on the substrate on which the aforementioned patterns are formed, and the anode thin film is patterned through a patterning process to form an anode layer. Subsequently, a pixel definition thin film is coated on the substrate on which the aforementioned patterns are formed, and a pixel definition layer is formed through mask, exposure, and development processes. The pixel definition layer is formed with a plurality of pixel openings exposing the anode layer. Subsequently, an organic emitting layer is formed in the aforementioned pixel openings, and the organic emitting layer is connected to an anode. Subsequently, a cathode thin film is deposited, the cathode thin film is patterned through a patterning process to form a cathode layer, and the cathode layer is electrically connected with the organic emitting layer and a second power supply line, respectively. In some examples, an encapsulation layer is formed on the cathode layer. The encapsulation layer may include a stacked structure of inorganic material/organic material/inorganic material.

In some examples, the first conductive layer, the second conductive layer, the third conductive layer and the fourth conductive layer may be made of a metal material, such as any one or more of Argentum (Ag), Copper (Cu), Aluminum (Al), and Molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first insulation layer, the second insulation layer, the third insulation layer and the fourth insulation layer may be made of any one or more of silicon oxide (SiOx), silicon nitride (SiNx) and silicon oxynitride (SiON), and may be a single layer, multi-layers, or a composite layer. The first insulation layer and the second insulation layer may be referred to as Gate Insulation (GI) layers, and the third insulation layer and the fourth insulation layer may be referred to as Interlayer Dielectric (ILD) layers. The first planarization layer and the second planarization layer may be made of an organic material, such as polyimide, acrylic, or polyethylene terephthalate. The pixel definition layer may be made of an organic material, such as polyimide, acrylic, or polyethylene terephthalate. The anode layer may be made of a reflective material such as a metal and the cathode layer may be made of a transparent conductive material. However, this embodiment is not limited thereto.

A structure and a preparing process of the display substrate of this embodiment are merely illustrative. In some examples, a corresponding structure may be changed and a patterning process may be increased or decreased according to actual needs. For example, when the display substrate is an LTPO display substrate, the circuit structure layer of the first display region may include: a first semiconductor layer, a first gate metal layer, a second gate metal layer, a second semiconductor layer, a third gate metal layer, a first source-drain metal layer, a second source-drain metal layer; and the first reset control line may be located in the first gate metal layer, the first data transfer line may be located in the first source-drain metal layer, and the first shielding wire may be located in the second gate metal layer or the third gate metal layer. This embodiment is not limited thereto.

The manufacturing process of this exemplary embodiment may be implemented using an existing mature manufacture equipment, and is compatible well with an existing manufacturing process, simple in process implementation, easy to implement, high in a production efficiency, low in a production cost, and high in a yield.

In some examples, a parasitic capacitance between the first data transfer line and the first reset control line is substantially 3.56 fF before the first shielding wire is not provided, and a parasitic capacitance between the first data transfer line and the first reset control line may be reduced to 0.3282 fF after the first shielding wire is provided. A parasitic capacitance between the second data line and the first reset control line is substantially 0.25 fF. A current difference between the first data line and the second data line is substantially 2.02% before the first shielding wire is not provided, and the current difference between the first data line and the second data line may be reduced to 0.19% after the first shielding wire is provided. The display substrate provided by this example may achieve a shielding effect between the first data transfer line and the first reset control line by providing a first shielding wire which is of an integral structure with the second initial signal line, thereby reducing the parasitic capacitance between the first data transfer line and the first reset control line, thereby reducing differences of the signal jump between the first data line and other data lines, and further improving the poor display in the display region, for example, the poor V-shaped illumination.

Figure 12:
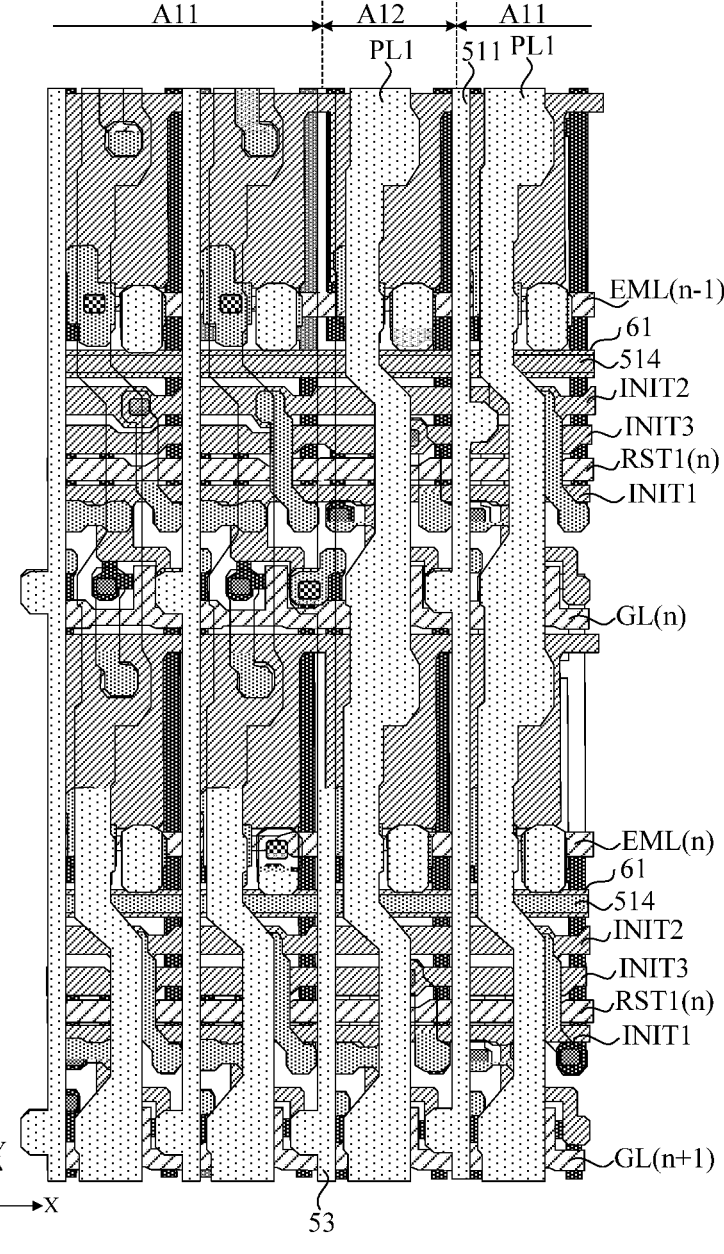
FIG. 12 is another partial plan schematic diagram of a first display region according to at least one embodiment of the present disclosure.
Figure 13A:
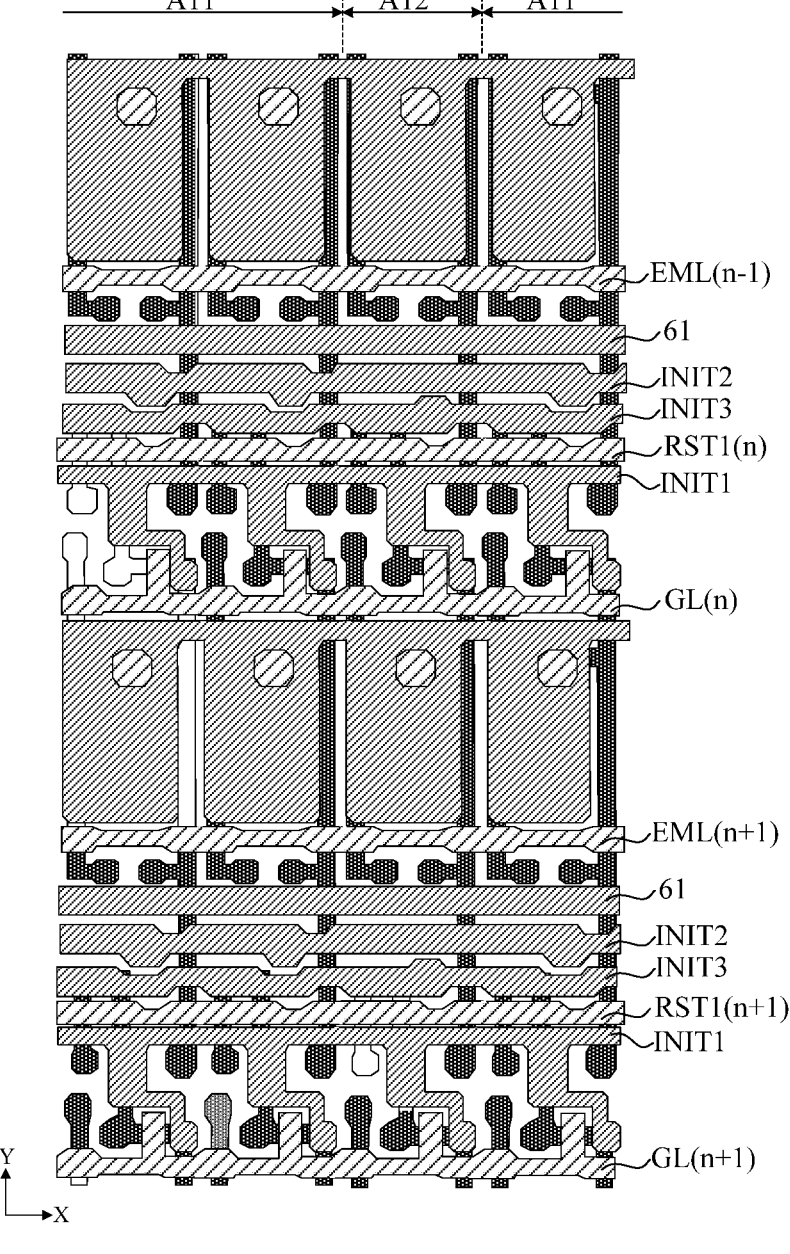
FIG. 13A is a partial plan schematic diagram of a first display region after a second conductive layer is formed in FIG. 12.
Figure 13B:
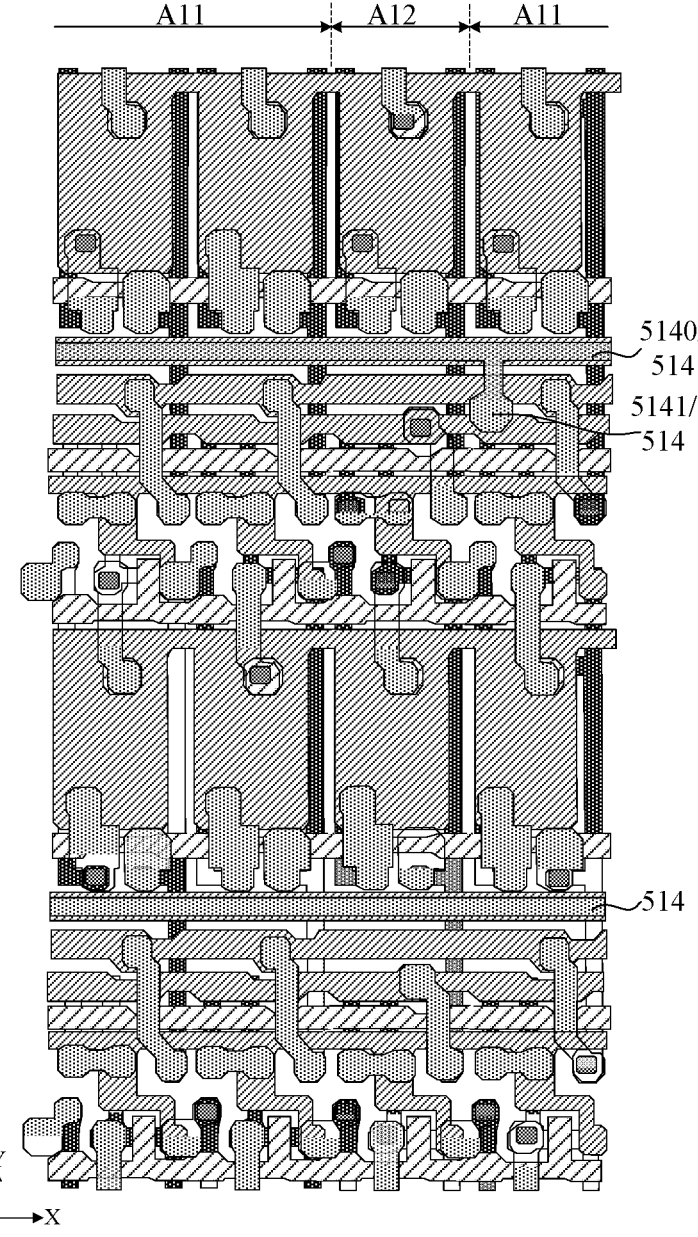
FIG. 13B is a partial plan schematic diagram of a first display region after the third conductive layer is formed in FIG. 12.

FIG. 12 is another partial plan schematic diagram of a first display region according to at least one embodiment of the present disclosure. FIG. 13A is a partial plan schematic diagram of a first display region after a second conductive layer is formed in FIG. 12. FIG. 13B is a partial plan schematic diagram of a first display region after the third conductive layer is formed in FIG. 12.

In some examples, as shown in FIG. 13A, the second conductive layer of the first display region may at least include: a plurality of first initial signal lines INIT1, a plurality of second initial signal lines INIT2, a plurality of third initial signal lines INIT3, and a plurality of first shielding wires 61. The first shielding wire 61 may be located on a side of the second initial signal line INIT2 away from the third initial signal line INIT3. The second initial signal line INIT2 is located on a side of the third initial signal line INIT3 away from the first reset control line RST1 (n). The first shielding wire 61 may extend along the first direction X. The first shielding wire 61 may extend to a peripheral region and be electrically connected to a peripheral power supply line in the peripheral region. For example, both ends of the first shielding wire 61 may respectively extend to the peripheral region and are electrically connected to the peripheral power supply line in the peripheral region. The peripheral power supply line may be configured to transmit a first voltage signal VDD or a second voltage signal VSS. In the present example, by arranging the first shielding wire to be electrically connected with a constant voltage power supply signal, it is beneficial to achieve a shielding effect between the first data transfer line and the first reset control line.

In some examples, as shown in FIG. 13B, the third conductive layer of the first display region may at least include a first data transfer line 514. The first data transfer line 514 may include a main body portion 5140 extending along the first direction X and a protrusion portion 5141 extending from the main body portion 5140 in the second direction Y. The protrusion portion 5141 may be located on a side of the main body portion 5140 close to the first reset control line. An orthographic projection of the main body portion 5140 of the first data transfer line 514 on the substrate may be located within a range of an orthographic projection of the first shielding wire 61 on the substrate. An orthographic projection of the protrusion portion 5141 on the substrate may be overlapped with an orthographic projection of the second initial signal line INIT2 and an orthographic projection of the third initial signal line INIT3 on the substrate. An orthographic projection of the transfer hole through which the first data transfer line 514 and the first sub-data line 511 are connected on the substrate may be located within a range of the orthographic projection of the protrusion portion 5141 on the substrate.

Rest of the structure of the display substrate according to this embodiment may be referred to descriptions of the aforementioned embodiments, and will not be repeated herein.

The display substrate provided by this example may achieve a shielding effect between the first data transfer line and the first reset control line by providing a first shielding wire which is electrically connected with the peripheral power supply line, thereby reducing the parasitic capacitance between the first data transfer line and the first reset control line, thereby reducing differences of the signal jump between the first data line and other data lines, and further improving the poor display in the display region, for example, the poor V-shaped illumination.

Figure 14:
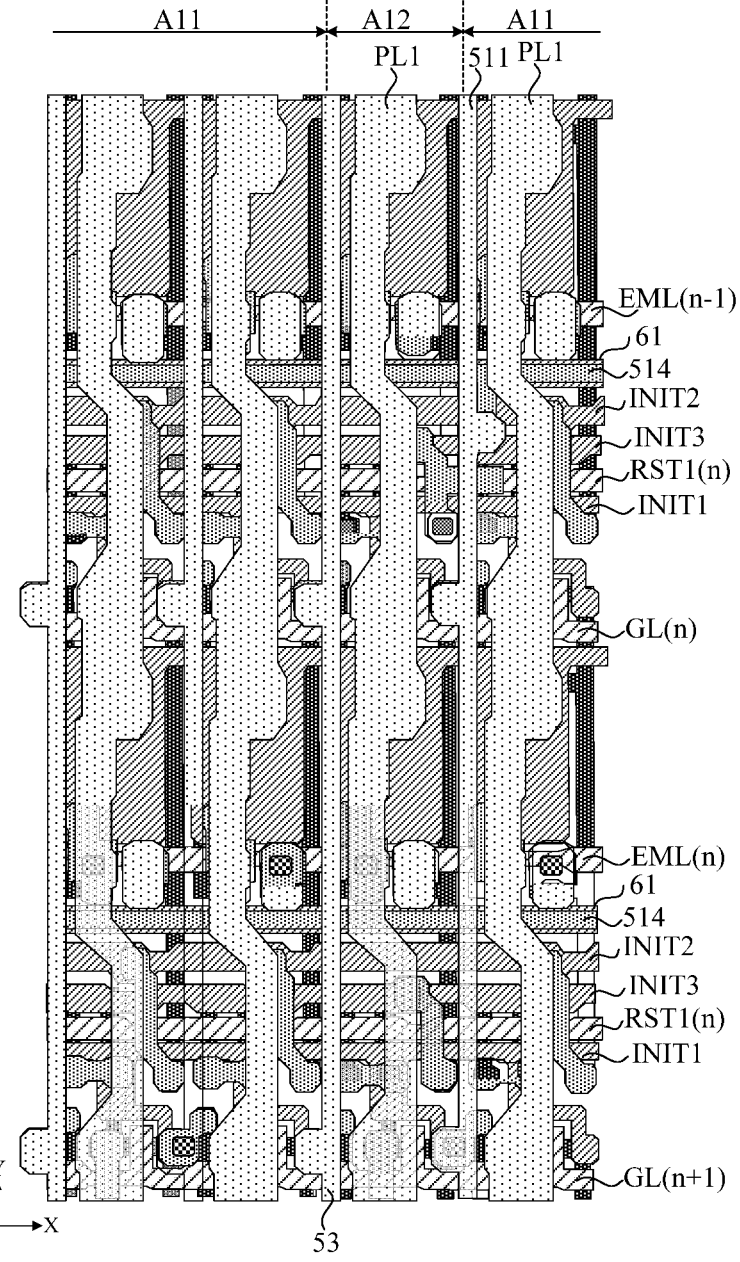
FIG. 14 is another partial plan schematic diagram of a first display region according to at least one embodiment of the present disclosure.
Figure 15A:
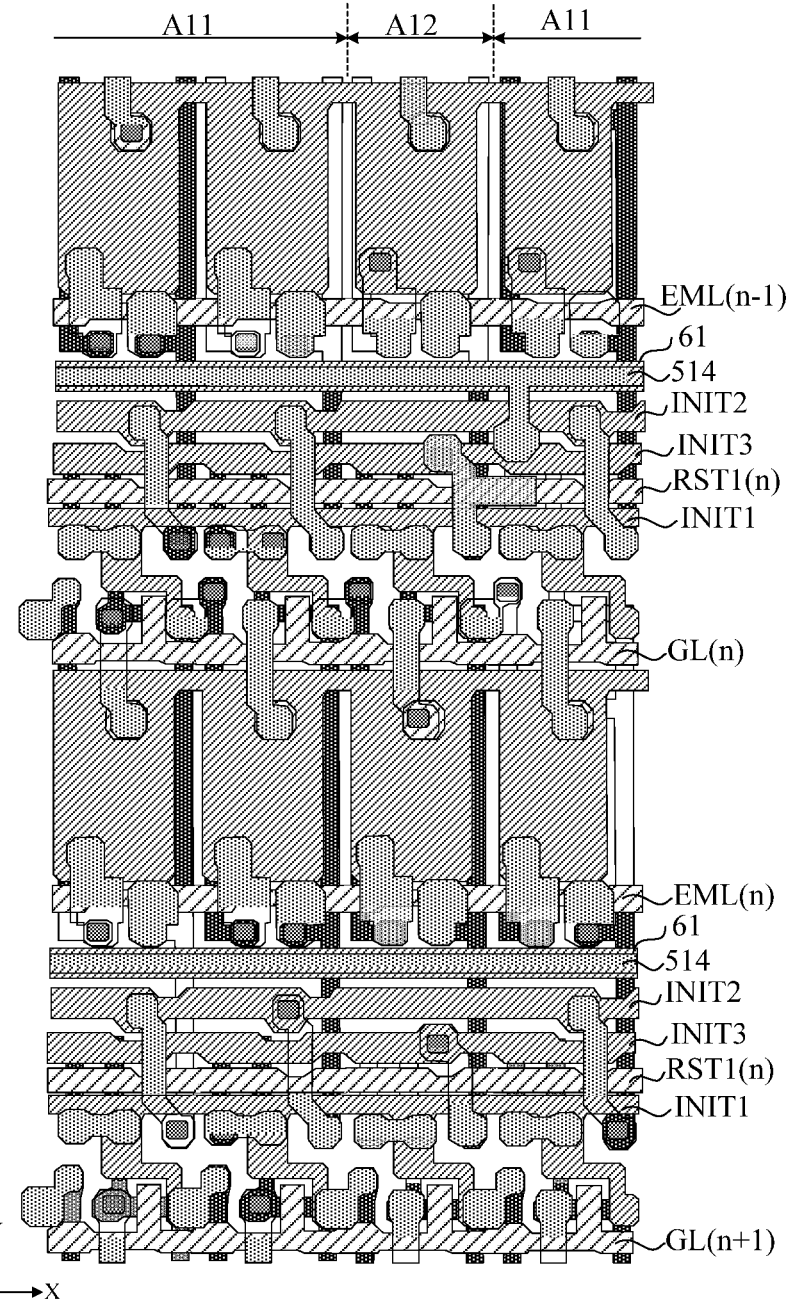
FIG. 15A is a partial plan schematic diagram of a first display region after a third conductive layer is formed in FIG. 14.
Figure 15B:
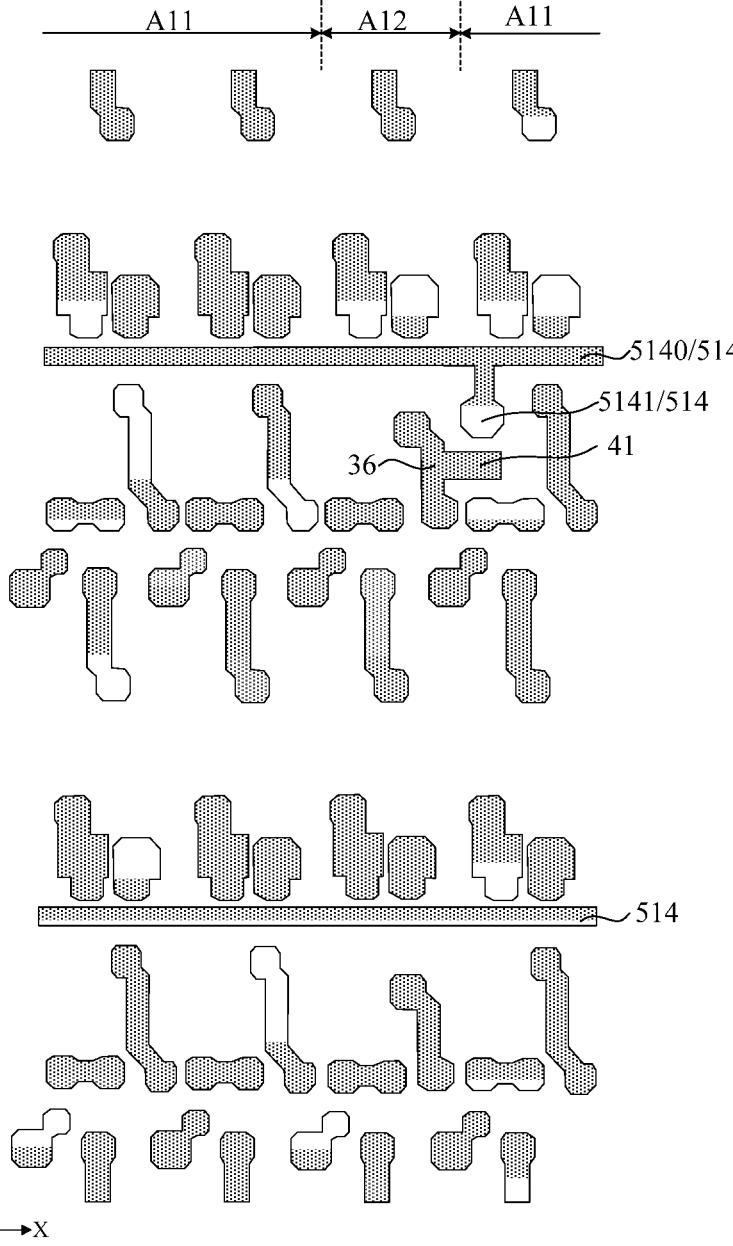
FIG. 15B is a plan schematic diagram of the third conductive layer in FIG. 15A.

FIG. 14 is another partial plan schematic diagram of a first display region according to at least one embodiment of the present disclosure. FIG. 15A is a partial plan schematic diagram of a first display region after a third conductive layer is formed in FIG. 14. FIG. 15B is a plan schematic diagram of the third conductive layer in FIG. 15A.

In some examples, as shown in FIG. 14 to FIG. 15B, the first data transfer line 514 located in the third conductive layer may include a main body portion 5140 extending along the first direction X, and a protrusion portion 5141 extending from the main body portion 5140 in the second direction Y. The protrusion portion 5141 may be located on a side of the main body portion 5140 close to the first reset control line. An orthographic projection of the main body portion 5140 of the first data transfer line 514 on the substrate may be within a range of the orthographic projection of the first shielding wire 61 on the substrate. An orthographic projection of the protrusion portion 5141 on the substrate may be overlapped with an orthographic projection of the second initial signal line INIT2 and an orthographic projection of the third initial signal line INIT3 on the substrate. An orthographic projection of the transfer hole through which the first data transfer line 514 and the first sub-data line 511 are connected on the substrate may be located within a range of the orthographic projection of the protrusion portion 5141 on the substrate.

In some examples, as shown in FIG. 15A and FIG. 15B, the third conductive layer of the first display region may further include at least one first shielding electrode 41. The first shielding electrode 41 may be electrically connected to the third initial signal line INIT3 through the sixteenth connection electrode 36. For example, the first shielding electrode 41 and the sixteenth connection electrode 36 may be of an integral structure. For example, the orthographic projection of the first shielding electrode 41 on the substrate may be rectangular. The first shielding electrode 41 may be located on a side of the protrusion portion 5141 away from the main body portion 5140. An orthographic projection of the first shielding electrode 41 on the substrate may be overlapped with an orthographic projection of the first reset control line RST1 ($n$) on the substrate. For example, a length of the first shielding electrode 41 along the second direction Y may be larger than a length of the first reset control line RST1 ($n$) along the second direction Y. In an overlapping region between the first shielding electrode 41 and the first reset control line RST1 ($n$), the first shielding electrode 41 may cover edges of both side of the first reset control line RST1 ($n$) in the second direction Y. However, this embodiment is not limited thereto. In other examples, the first shielding electrode 41 may be electrically connected with a second initial signal line.

In the display substrate provided by this example, a first shielding electrode is arranged on a side of the transfer hole of the first data transfer line and the first sub-data line close to the first reset control line, and the first shielding electrode may achieve a shielding effect between the transfer hole and the first reset control line, thus reducing the capacitive coupling between the transfer hole and the first reset control line.

The description for remaining structures of the display substrate of the present embodiment may refer to the description in the aforementioned embodiments, and thus will not be repeated here.

Figure 16:
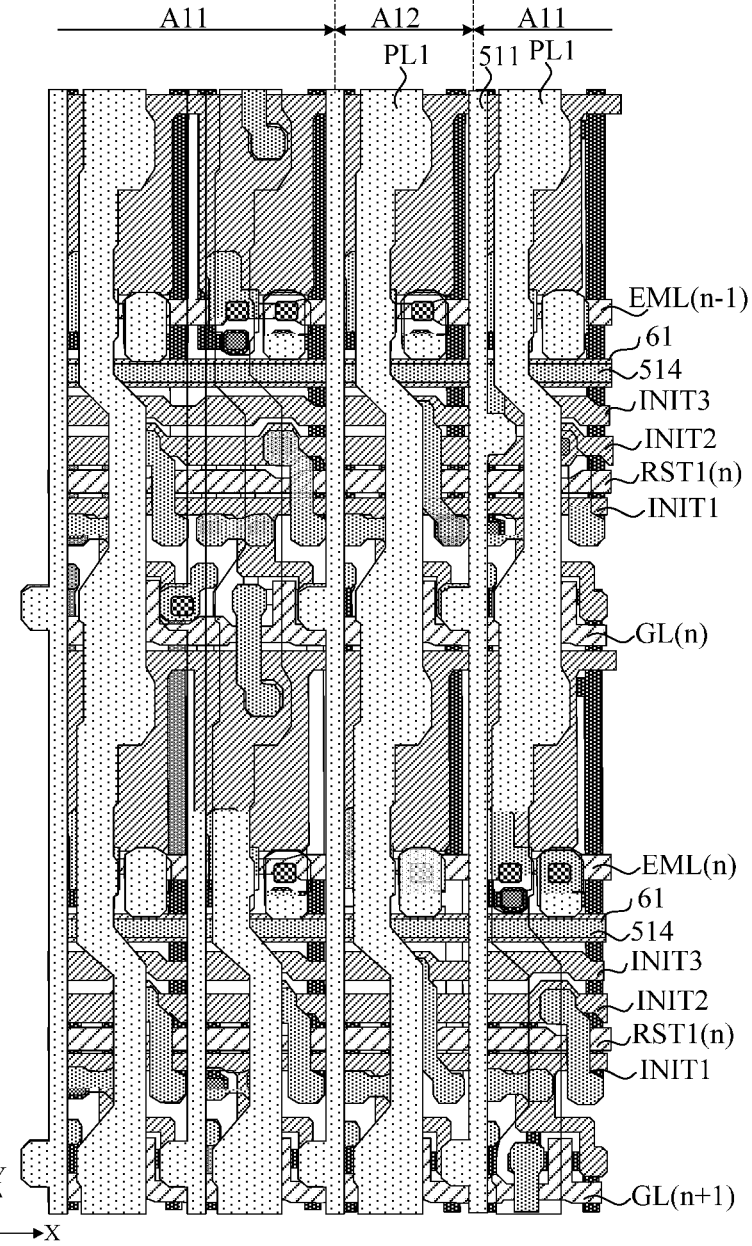
FIG. 16 is another partial plan schematic diagram of a first display region according to at least one embodiment of the present disclosure.
Figure 17:
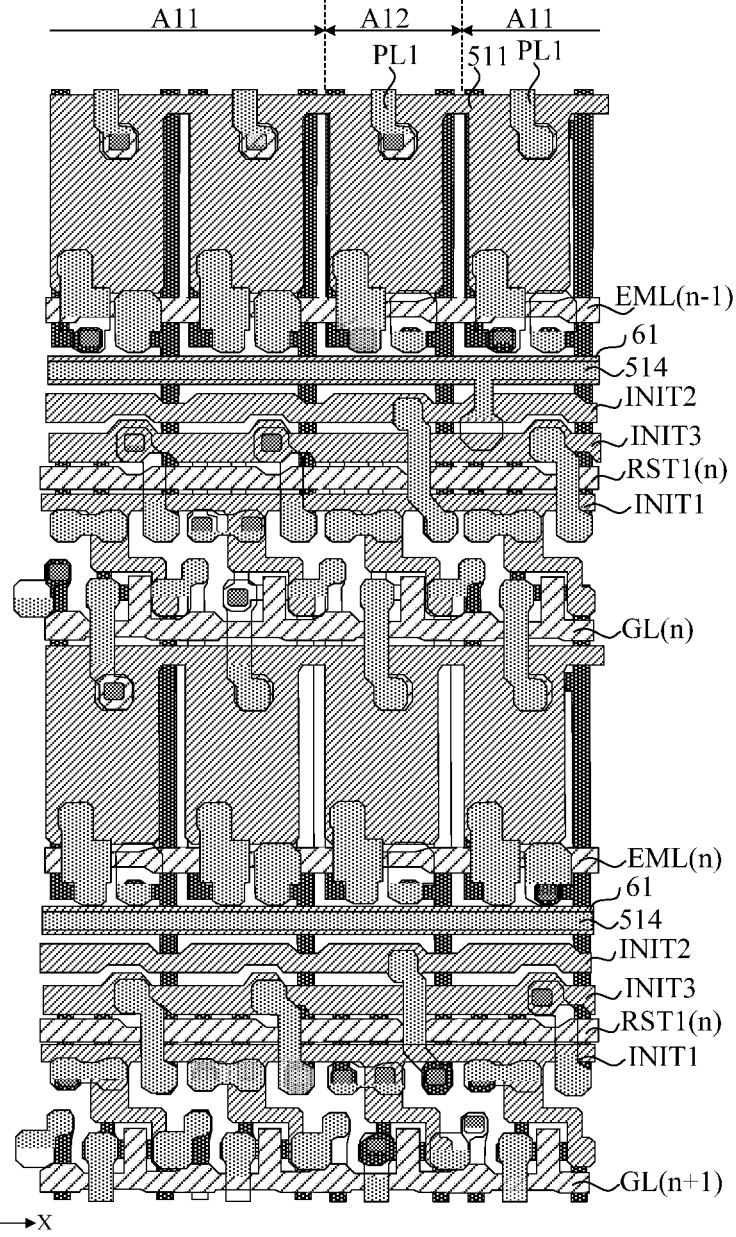
FIG. 17 is a partial plan schematic diagram of a first display region after a third conductive layer is formed in FIG. 16.

FIG. 16 is another partial plan schematic diagram of a first display region according to at least one embodiment of the present disclosure. FIG. 17 is a partial plan schematic diagram of a first display region after a third conductive layer is formed in FIG. 16.

In some examples, as shown in FIG. 16 and FIG. 17, the second conductive layer of the first display region may at least include: a plurality of first initial signal lines INIT1, a plurality of second initial signal lines INIT2, a plurality of third initial signal lines INIT3, and a plurality of first shielding wires 61. The first shielding wire 61 may be located on a side of the third initial signal line INIT3 away from the second initial signal line INIT2. The third initial signal line INIT3 may be located on a side of the second initial signal line INIT2 away from the first reset control line RST1 ($n$). The first shielding wire 61 may extend along the first direction X. The first shielding wire 61 may extend to a peripheral region and be electrically connected to a peripheral power supply line in the peripheral region. The peripheral power supply line may be configured to transmit a first voltage signal VDD or a second voltage signal VSS. In the present example, by arranging the first shielding wire to be electrically connected with a constant voltage power supply signal, it is beneficial to achieve a shielding effect between the first data transfer line and the first reset control line.

Rest of the structure of the display substrate according to this embodiment may be referred to descriptions of the aforementioned embodiments, and will not be repeated herein.

Figure 18:
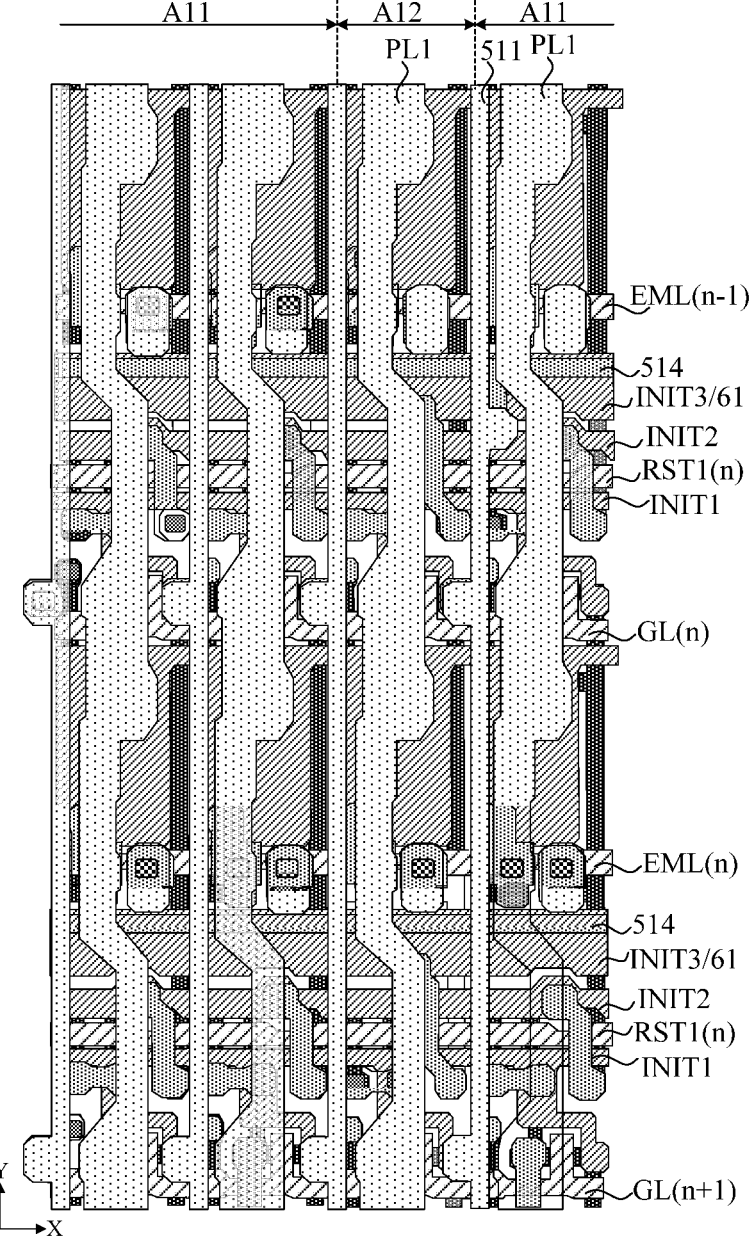
FIG. 18 is another partial plan schematic diagram of a first display region according to at least one embodiment of the present disclosure.
Figure 19:
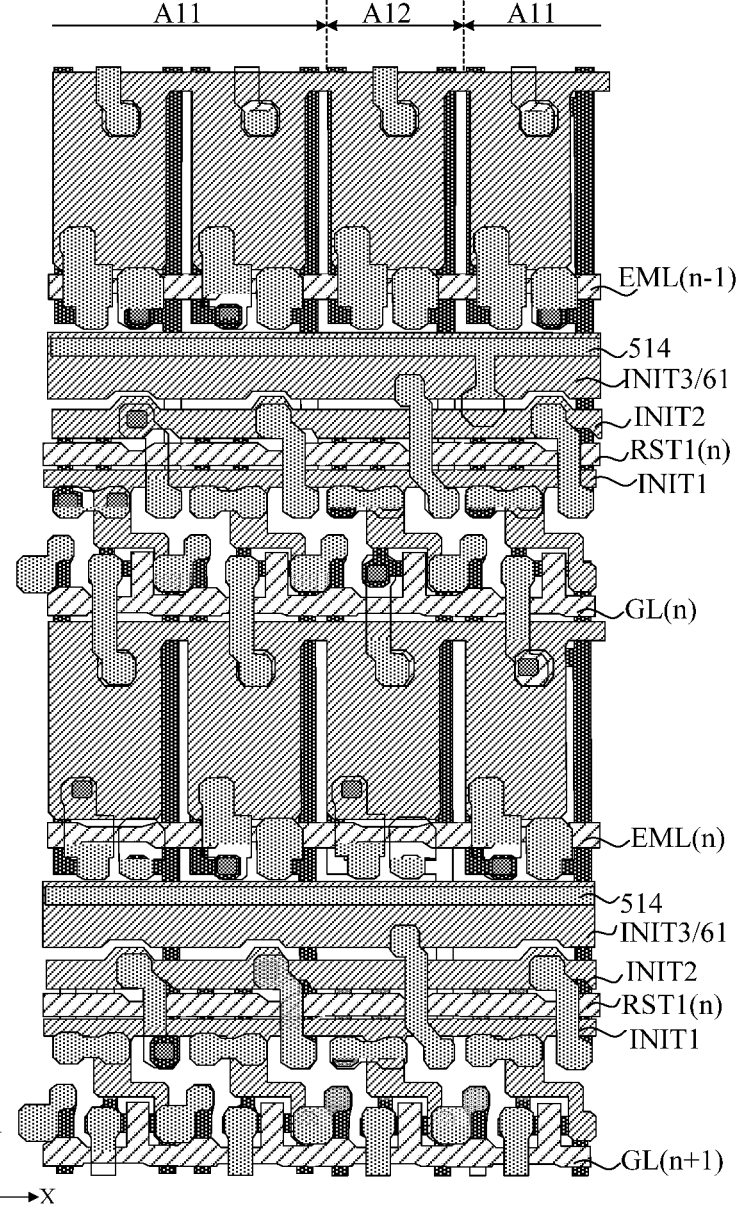
FIG. 19 is a partial plan schematic diagram of a first display region after a third conductive layer is formed in FIG. 18.

FIG. 18 is another partial plan schematic diagram of a first display region according to at least one embodiment of the present disclosure. FIG. 19 is a partial plan schematic diagram of a first display region after a third conductive layer is formed in FIG. 18.

In some examples, as shown in FIG. 18 and FIG. 19, the second conductive layer of the first display region may at least include: a plurality of first initial signal lines INIT1, a plurality of second initial signal lines INIT2, a plurality of third initial signal lines INIT3, and a plurality of first shielding wires 61. The third initial signal line INIT3 may be located on a side of the second initial signal line INIT2 away from the first reset control line RST1 (*n*). The first shielding wire 61 may be located on a side of the third initial signal line INIT3 away from the second initial signal line INIT2. The first shielding wire 61 and the third initial signal line INIT3 may be of an integral structure. An orthographic projection of the first data transfer line 514 on the substrate may be overlapped with an orthographic projection of the first shielding wire 61 on the substrate.

Rest of the structure of the display substrate according to this embodiment may refer to descriptions of the aforementioned embodiments, and will not be repeated herein.

Figure 20:
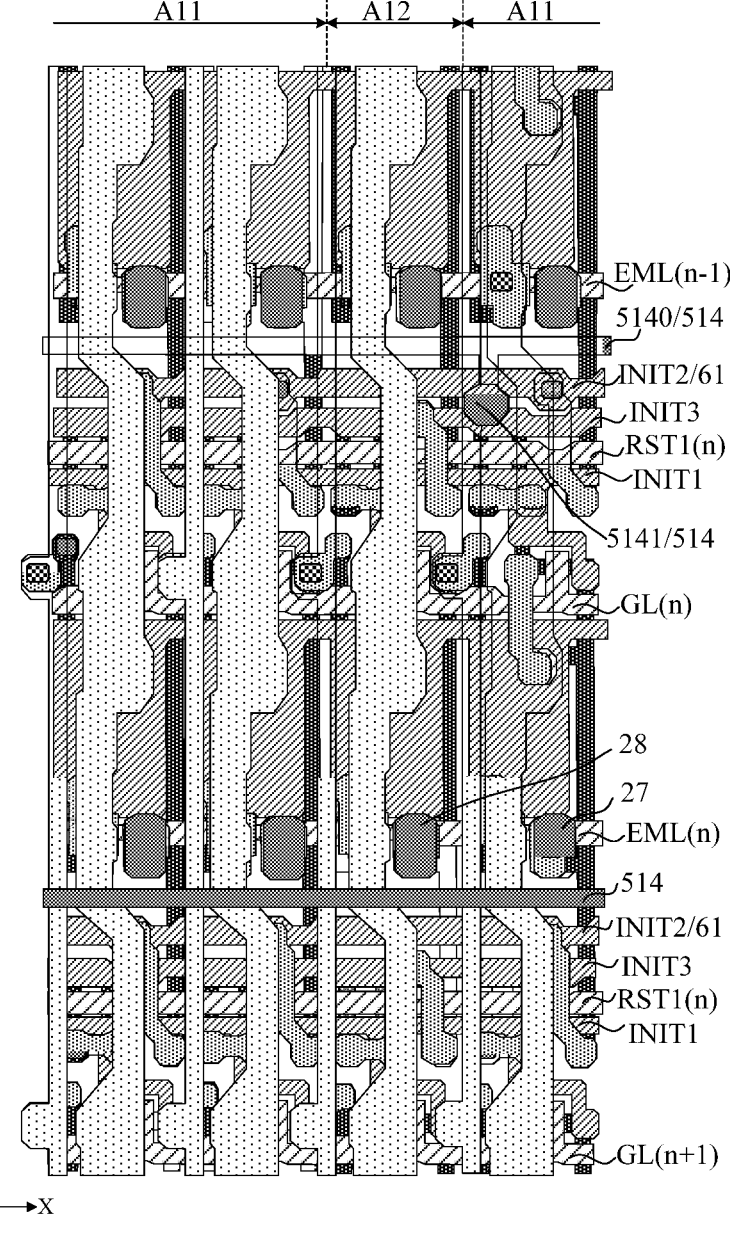
FIG. 20 is another partial plan schematic diagram of a first display region according to at least one embodiment of the present disclosure.

FIG. 20 is another partial plan schematic diagram of a first display region according to at least one embodiment of the present disclosure. In some examples, in a direction perpendicular to the display substrate, the circuit structure layer of the first display region may include a semiconductor layer, a first conductive layer, a second conductive layer, a third conductive layer, a fourth conductive layer and a fifth conductive layer which are arranged sequentially on the substrate. A first insulation layer may be arranged between the semiconductor layer and the first conductive layer, a second insulation layer may be arranged between the first conductive layer and the second conductive layer, a third insulation layer may be arranged between the second conductive layer and the third conductive layer, a fourth insulation layer may be arranged between the third conductive layer and the fourth conductive layer, and a fifth insulation layer may be arranged between the fourth conductive layer and the fifth conductive layer. The first conductive layer may also be referred to as a first gate metal layer, the second conductive layer may also be referred to as a second gate metal layer, the third conductive layer may also be referred to as a first source-drain metal layer, the fourth conductive layer may also be referred to as a second source-drain metal layer, and the fifth conductive layer may also be referred to as a third source-drain metal layer. In some examples, the first insulation layer to the fifth insulation layer may all be inorganic insulation layers.

In some examples, as shown in FIG. 20, the second conductive layer of the first display region may at least include: a plurality of first initial signal lines INIT1, a plurality of second initial signal lines INIT2, a plurality of third initial signal lines INIT3, and a plurality of first shielding wires 61. The first shielding wire 61 and the second initial signal line INIT2 may be of an integral structure. In some examples, a length of the integral structure of the first shielding wire 61 and the second initial signal line INIT2 along the second direction Y may be greater than a length of the third initial signal line INIT3 along the second direction Y. The remaining structures of the semiconductor layer, the first conductive layer and the second conductive layer of the first display region are similar to those of the aforementioned embodiments, and thus will not be repeated here.

Figure 21A:
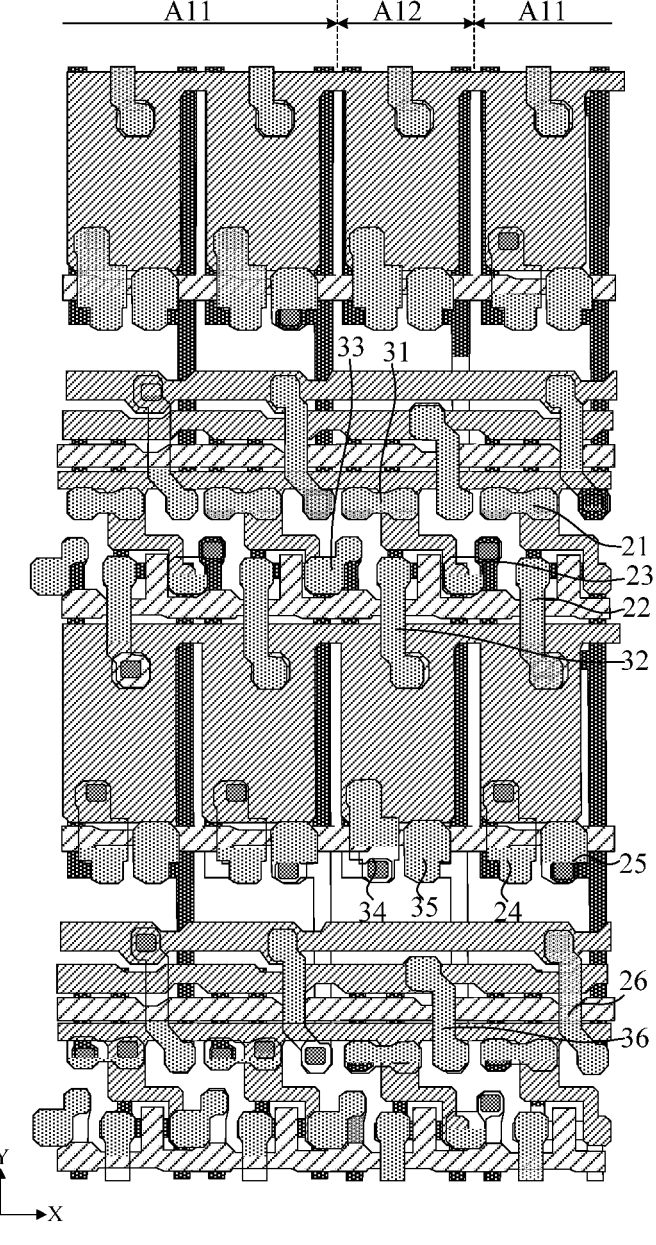
FIG. 21A is a partial plan schematic diagram of a first display region after a third conductive layer is formed in FIG. 20.

FIG. 21A is a partial plan schematic diagram of a first display region after the third conductive layer is formed in FIG. 20. In some examples, as shown in FIG. 21A, the third conductive layer of the first display region may include a plurality of connection electrodes (e.g. including a first connection electrode 21 to a sixth connection electrode 26, an eleventh connection electrode 31 to a sixteenth connection electrode 36). A structure of the third conductive layer may be referred to the descriptions of the aforementioned embodiments and thus are not repeated here.

Figure 21B:
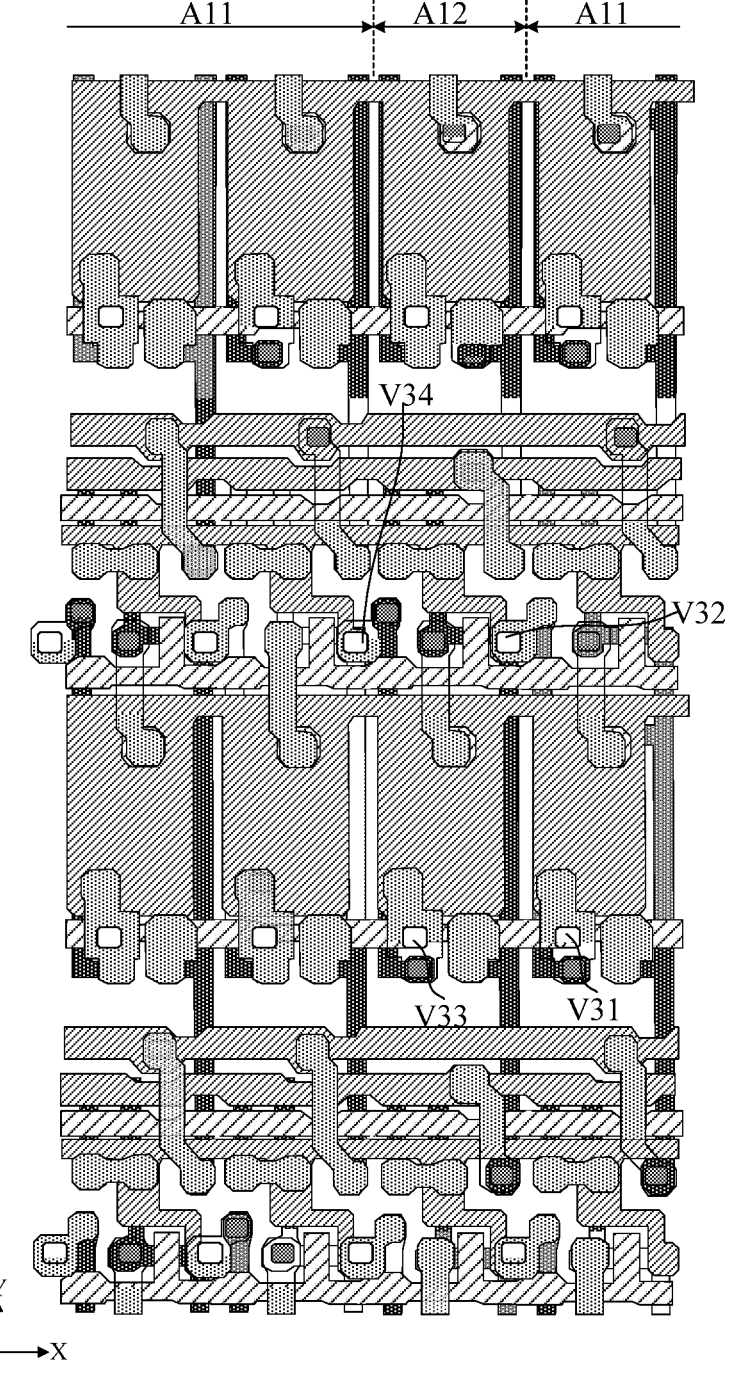
FIG. 21B is a partial plan schematic diagram of a first display region after a fourth insulation layer is formed in FIG. 20.

FIG. 21B is a partial plan schematic diagram of a first display region after a fourth insulation layer is formed in FIG. 20. In some examples, as shown in FIG. 21B, the fourth insulation layer of the first display region may be provided with a plurality of via holes, which may include, for example, a thirty-first via hole V31 to a thirty-fourth via hole V34. The fourth insulation layer within the thirty-first via hole V31 to the thirty-fourth via hole V34 may be removed to expose a portion of a surface of the third conductive layer.

Figure 21C:
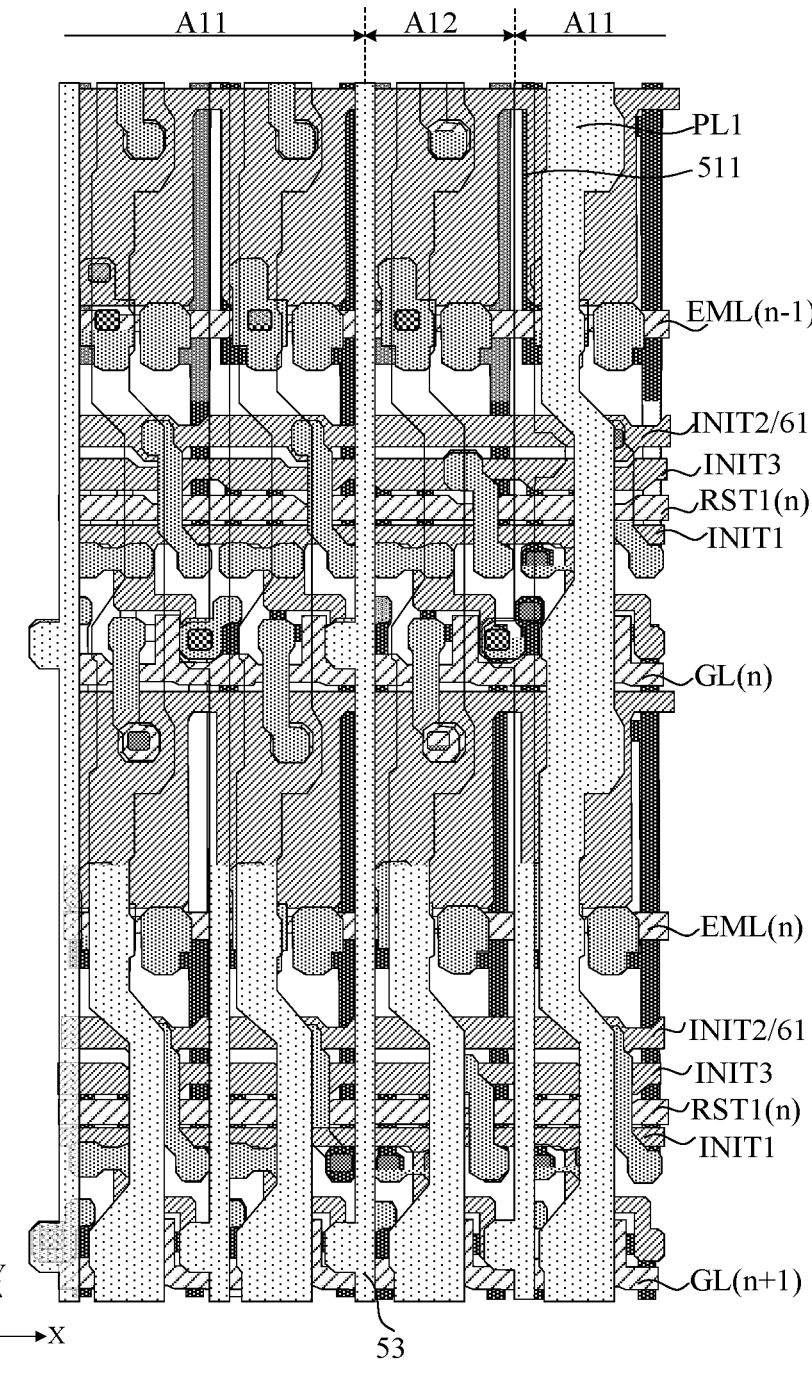
FIG. 21C is a partial plan schematic diagram of a first display region after a fourth conductive layer is formed in FIG. 20.

FIG. 21C is a partial plan schematic diagram of a first display region after a fourth conductive layer is formed in FIG. 20. In some examples, as shown in FIG. 21C, the fourth conductive layer of the first display region may at least include a plurality of first power supply lines PL1, a first sub-data line 511 and a second sub-data line (not shown) of the first data line, and a third data line 53. The first power supply line PL1, the first sub-data line 511, and the second sub-data line may all extend along the second direction Y. The first power supply line PL1 located in the first circuit region A11 may be electrically connected to the fourth connection electrode 24 through the thirty-first via hole V31 to achieve an electrical connection to the first light emitting control transistor and the first storage capacitor of the first pixel circuit. The first power supply line PL1 located in the second circuit region A12 may be electrically connected to the fourteenth connection electrode 34 through the thirty-third via hole V33 to achieve an electrical connection to the first light emitting control transistor and the second storage capacitor of the invalid pixel circuit. The first sub-data line 511 may be electrically connected to the third connection electrode 23 through the thirty-second via hole V32 to achieve an electrical connection to the data writing transistor of the first pixel circuit. The third data line 53 may be electrically connected to the thirteenth connection electrode 33 through the thirty-fourth via hole V34 to achieve an electrical connection to the data writing transistor of the invalid pixel circuit.

Figure 21D:
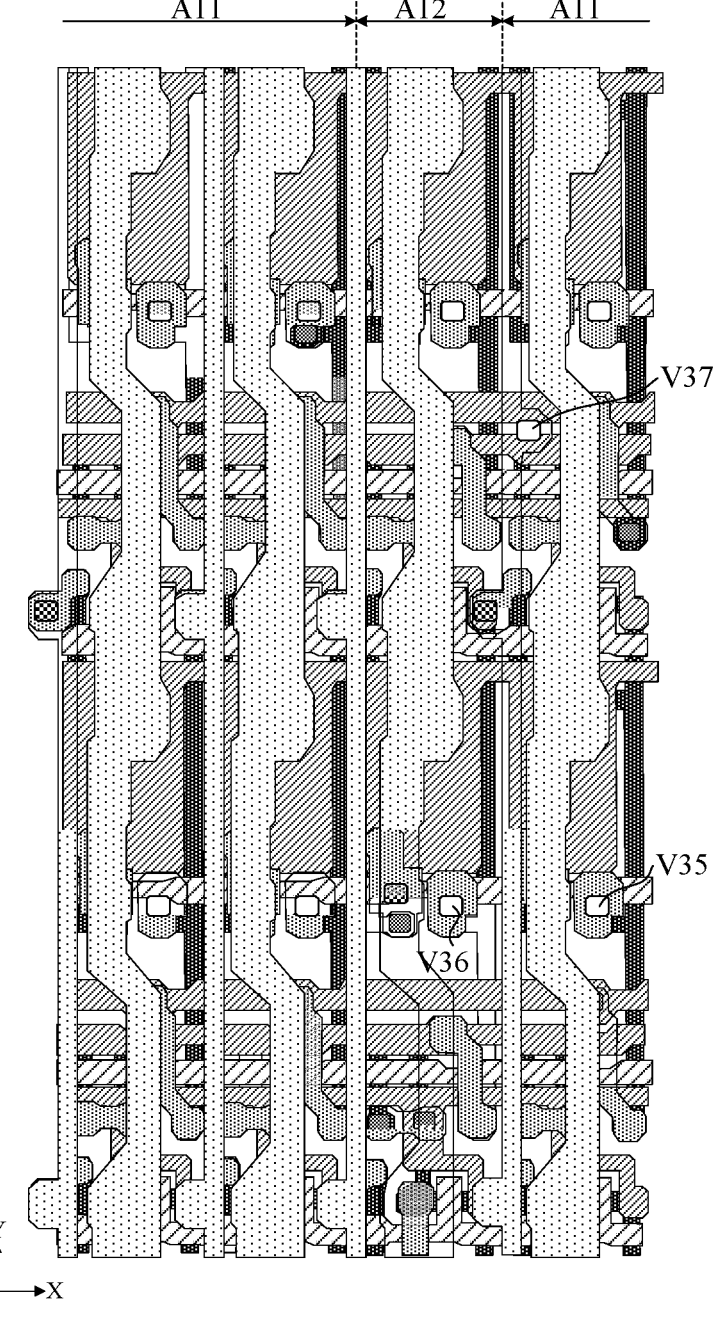
FIG. 21D is a partial plan schematic diagram of a first display region after a fifth insulation layer is formed in FIG. 20.

FIG. 21D is a partial plan schematic diagram of a first display region after a fifth insulation layer is formed in FIG. 20. In some examples, as shown in FIG. 21D, the fifth insulation layer of the first display region may be provided with a plurality of via holes, which may include, for example, a thirty-fifth via hole V35 to a thirty-sixth via hole V36, and a transfer hole V37. The fifth insulation layer and the fourth insulation layer within the thirty-fifth via hole V35 to the thirty-sixth via hole V36 may be removed to expose a portion of a surface of the third conductive layer, and the fifth insulation layer within the transfer hole V37 may be removed to expose a portion of a surface of the fourth conductive layer.

In some examples, as shown in FIG. 20, the fifth conductive layer of the first display region may at least include a first data transfer line 514 and a plurality of connection electrodes (e.g. including a seventh connection electrode 27 and an eighth connection electrode 28). The first data transfer line 514 may include a main body portion 5140 extending along the first direction X and a protrusion portion 5141 extending from the main body portion 5140 along the second direction Y. The protrusion portion 5141 may be electrically connected to the first sub-data line 511 through the transfer hole V37. An orthographic projection of the main body portion 5140 on the substrate may not be overlapped with an orthographic projection of the first shielding wire 61 on the substrate. The orthographic projection of the first shielding wire 61 on the substrate may be located between an orthographic projection of the main body portion 5140 on the substrate and an orthographic projection of the third initial signal line INIT3 on the substrate. The first shielding wire 61 may be located on a side of the first data transfer line 514 close to the first reset control line RST1 (*n*). An orthographic projection of the protrusion portion 5141 on the substrate may be overlapped with the orthographic projection of the first shielding wire 61 on the substrate.

In some examples, the seventh connection electrode 27 may be electrically connected to the fifth connection electrode 25 through the thirty-fifth via hole V35 to achieve an electrical connection to the second light emitting control transistor T6 of the first pixel circuit, and the seventh connection electrode 27 may subsequently be electrically connected to the anode of the first light emitting element. The eighth connection electrode 28 may be electrically connected to the fifteenth connection electrode 35 through the thirty-sixth via hole V36 to achieve an electrical connection to the second light emitting control transistor M6 of the invalid pixel circuit, and the eighth connection electrode 28 does not need to be subsequently electrically connected to the anode of the light emitting element.

In the display substrate provided by this example, the first data transfer line is arranged in the fifth conductive layer, which may increase the spatial distance between the first data transfer line and the first reset control line, and may achieve a shielding effect by using the second initial signal line as the first shielding wire. In some examples, after the first data transfer line is arranged at the fifth conductive layer and the remaining data lines are arranged in the fourth conductive layer, the parasitic capacitance between the second data line and the first reset control line may be substantially 0.805 fF, and the parasitic capacitance between the first data transfer line and the first reset control line may be reduced to 1.97 fF. In the related art, the current difference between the first data line and the second data line is substantially 2.02%, and after the first shielding wire is arranged in this example, the current difference between the first data line and the second data line may be reduced to 0.25%. The display substrate provided by this example may achieve a shielding affect between the first data transfer line and the first reset control line by increasing the spatial distance between the first data transfer line and the first reset control line and combining the first shielding wire which is of an integral structure with the second initial signal line, thereby reducing the parasitic capacitance between the first data transfer line and the first reset control line, thereby reducing differences of the signal jump between the first data line and other data lines, and further improving the poor display in the display region, for example, the poor V-shaped illumination.

Figure 22:
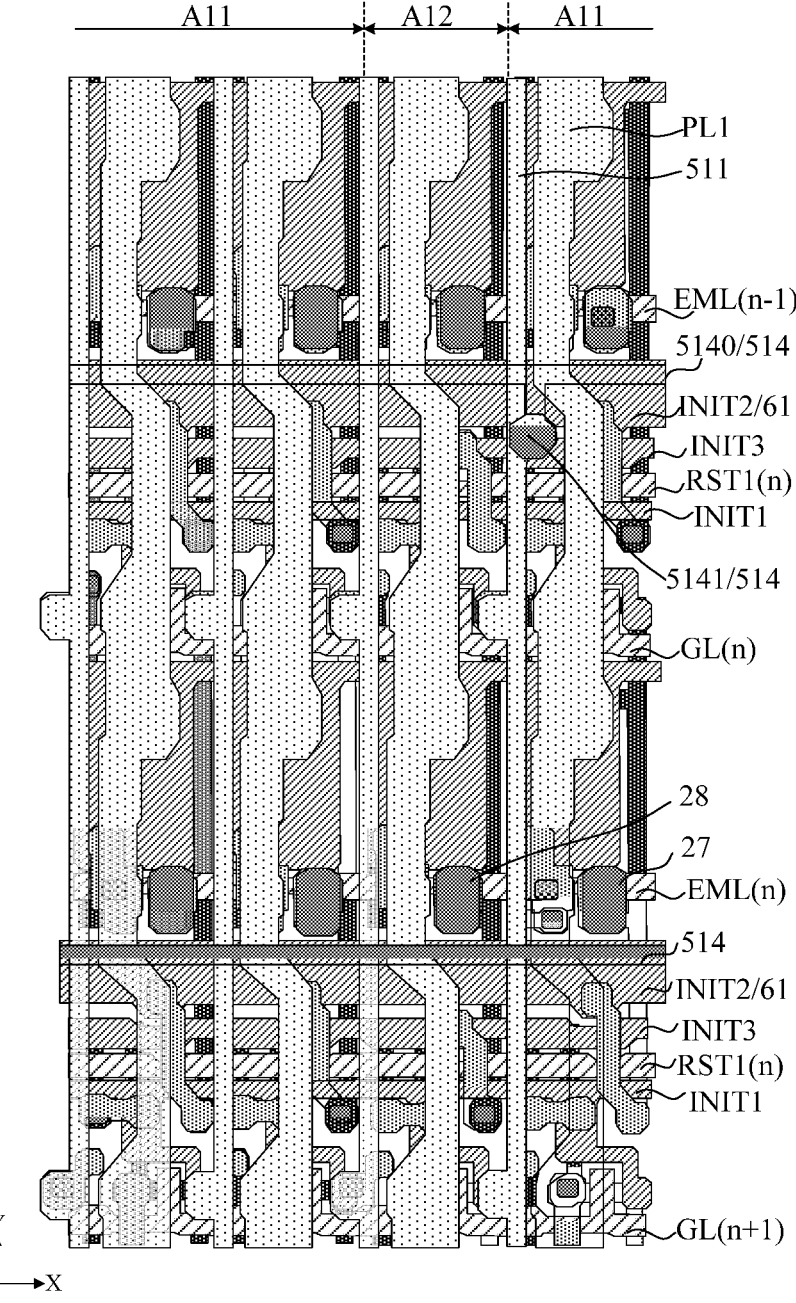
FIG. 22 is another partial plan schematic diagram of a first display region according to at least one embodiment of the present disclosure.
Figure 23:
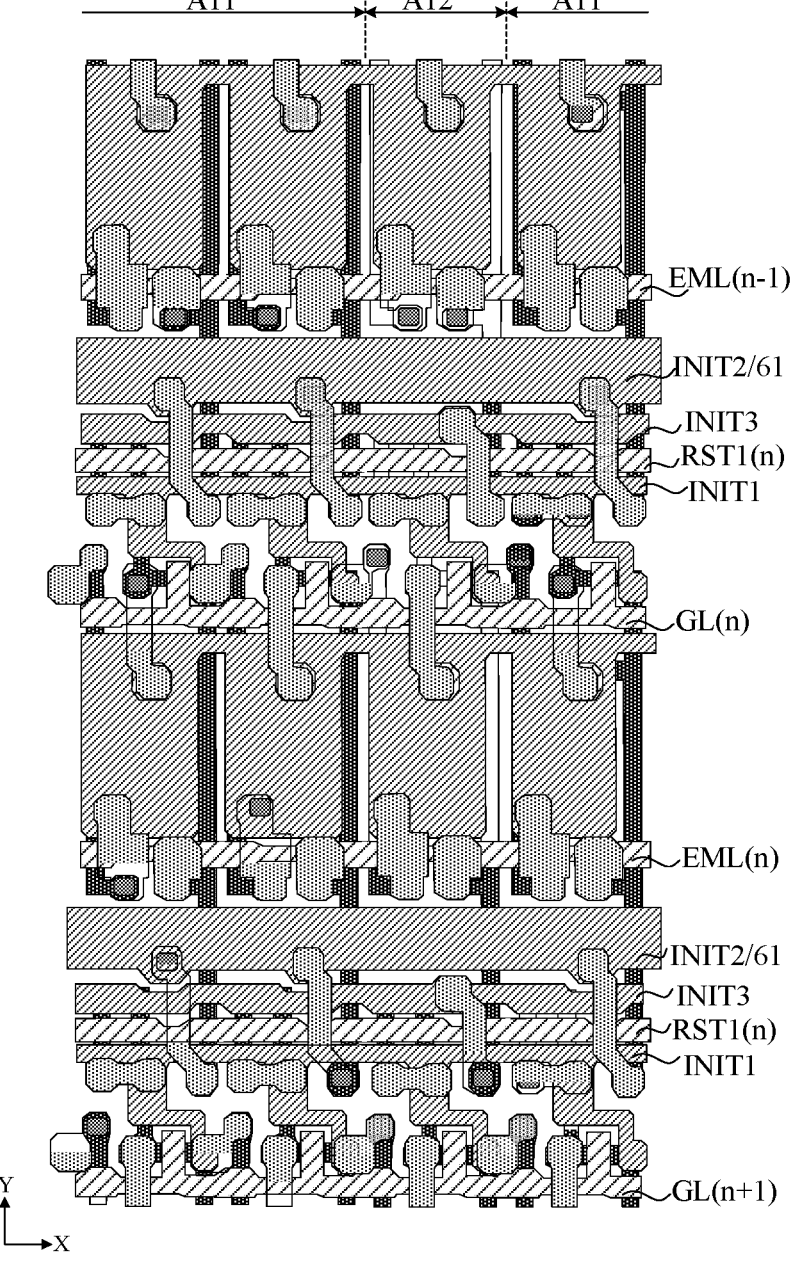
FIG. 23 is a partial plan schematic diagram of a first display region after a third conductive layer is formed in FIG. 22.

FIG. 22 is another partial plan schematic diagram of a first display region according to at least one embodiment of the present disclosure. FIG. 23 is a partial plan schematic diagram of a first display region after a third conductive layer is formed in FIG. 22.

In some examples, as shown in FIG. 22 and FIG. 23, the circuit structure layer of the first display region may include a semiconductor layer, a first conductive layer to a fifth conductive layer arranged on the substrate. The first data transfer line 514 may be located in the fifth conductive layer, and the first sub-data line 511 may be located in the fourth conductive layer. The second conductive layer of the first display region may at least include: a plurality of first initial signal lines INIT1, a plurality of second initial signal lines INIT2, a plurality of third initial signal lines INIT3, and a plurality of first shielding wires 61. The first shielding wire 61 and the second initial signal line INIT2 may be of an integral structure. The fifth conductive layer of the first display region may at least include a plurality of first data transfer lines 514. An orthographic projection of the main body portion 5140 of the first data transfer line 514 on the substrate may be within a range of the orthographic projection of the first shielding wire 61 on the substrate.

Rest of the structure of the display substrate according to this embodiment may refer to descriptions of the aforementioned embodiments, and will not be repeated herein.

Figure 24:
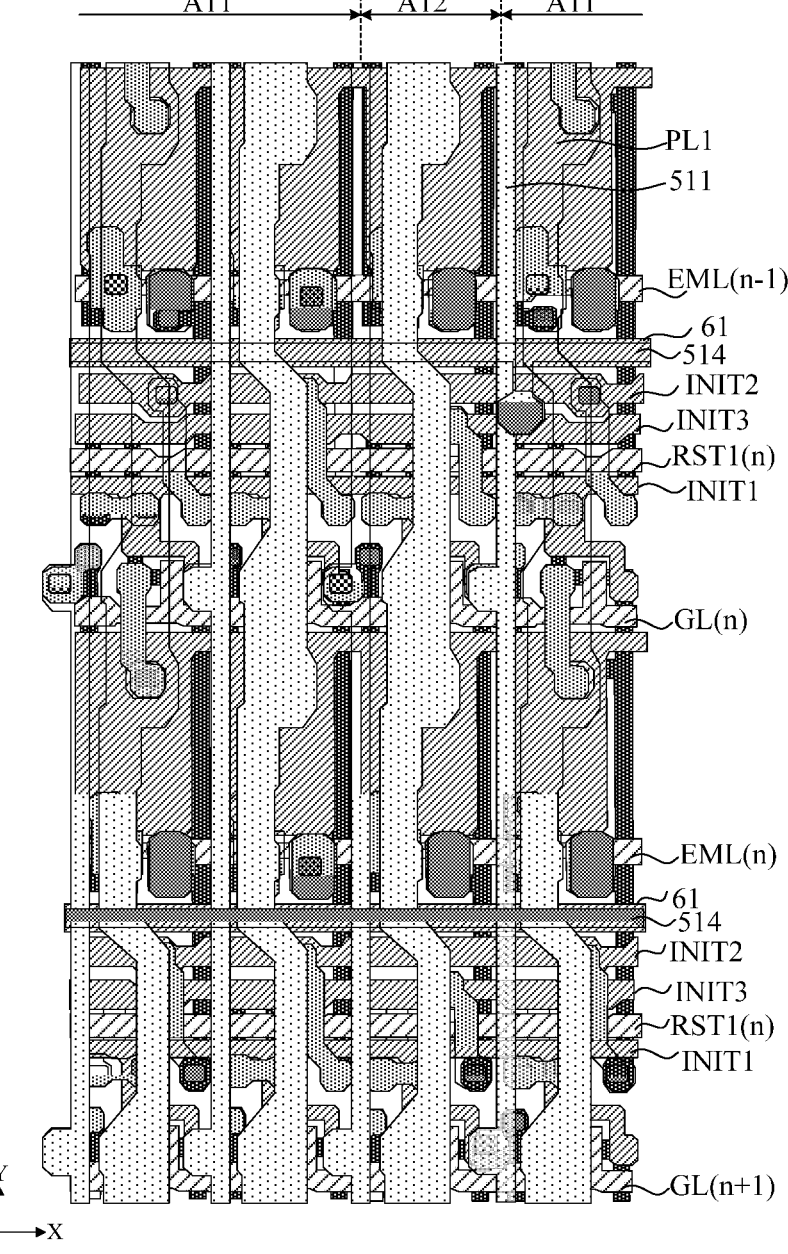
FIG. 24 is another partial plan schematic diagram of a first display region according to at least one embodiment of the present disclosure.
Figure 25:
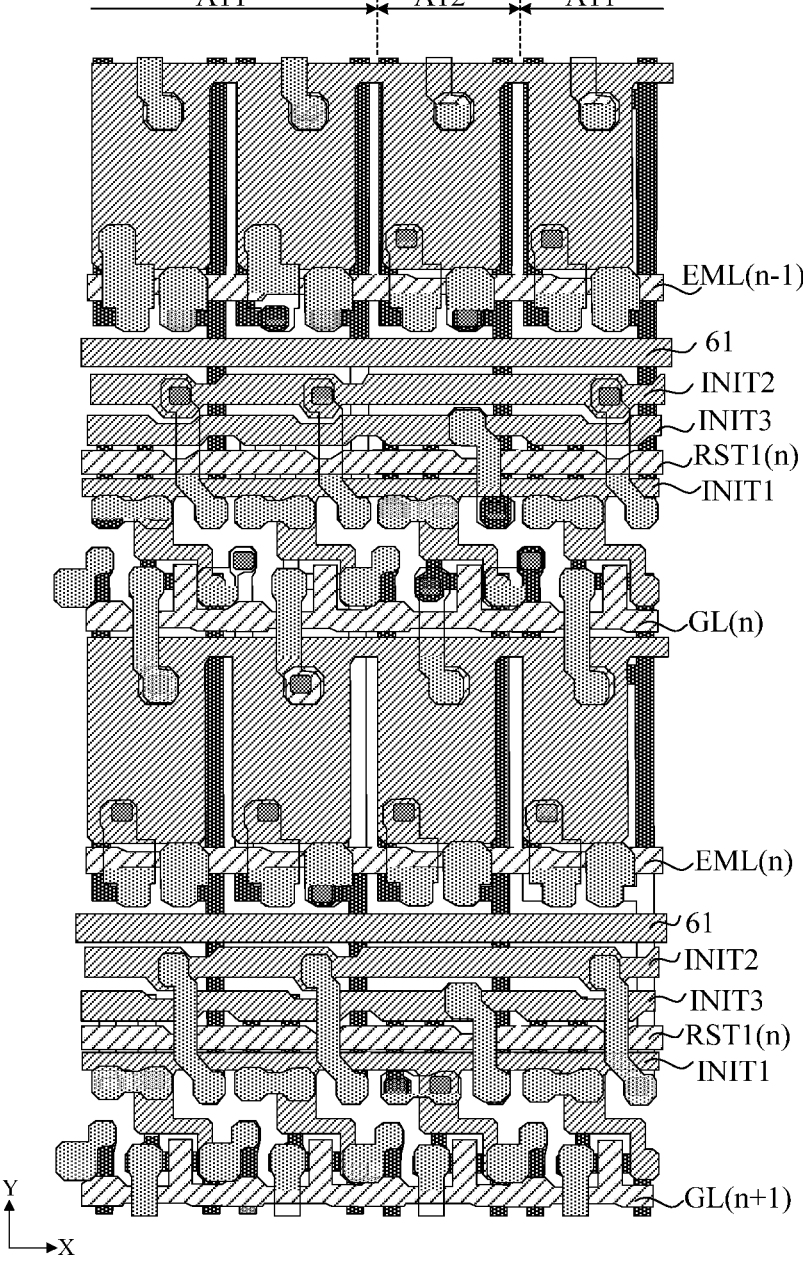
FIG. 25 is a partial plan schematic diagram of a first display region after a third conductive layer is formed in FIG. 24.

FIG. 24 is another partial plan schematic diagram of a first display region according to at least one embodiment of the present disclosure. FIG. 25 is a partial plan schematic diagram of a first display region after a third conductive layer is formed in FIG. 24.

In some examples, as shown in FIG. 24 and FIG. 25, the circuit structure layer of the first display region may include a semiconductor layer, a first conductive layer to a fifth conductive layer arranged on the substrate. The first data transfer line 514 may be located in the fifth conductive layer, and the first sub-data line 511 may be located in the fourth conductive layer. The second conductive layer of the first display region may at least include: a plurality of first initial signal lines INIT1, a plurality of second initial signal lines INIT2, a plurality of third initial signal lines INIT3, and a plurality of first shielding wires 61. The second initial signal line INIT2 is located on a side of the third initial signal line INIT3 away from the first reset control line RST1 (*n*). The first shielding wire 61 may extend along the first direction X. The first shielding wire 61 may extend to a peripheral region and be electrically connected to a peripheral power supply line in the peripheral region. The peripheral power supply line may be configured to transmit a first voltage signal VDD or a second voltage signal VSS. In the present example, by arranging the first shielding wire to be electrically connected with a constant voltage power supply signal, it is beneficial to achieve a shielding effect between the first data transfer line and the first reset control line. An orthographic projection of the main body portion of the first data transfer line 514 on the substrate may be within a range of the orthographic projection of the first shielding wire 61 on the substrate. Alternatively, the orthographic projection of the main body portion of the first data transfer line 514 on the substrate may be partially overlapped with the orthographic projection of the first shielding wire 61 on the substrate.

Rest of the structure of the display substrate according to this embodiment may refer to descriptions of the aforementioned embodiments, and will not be repeated herein.

Figure 26:
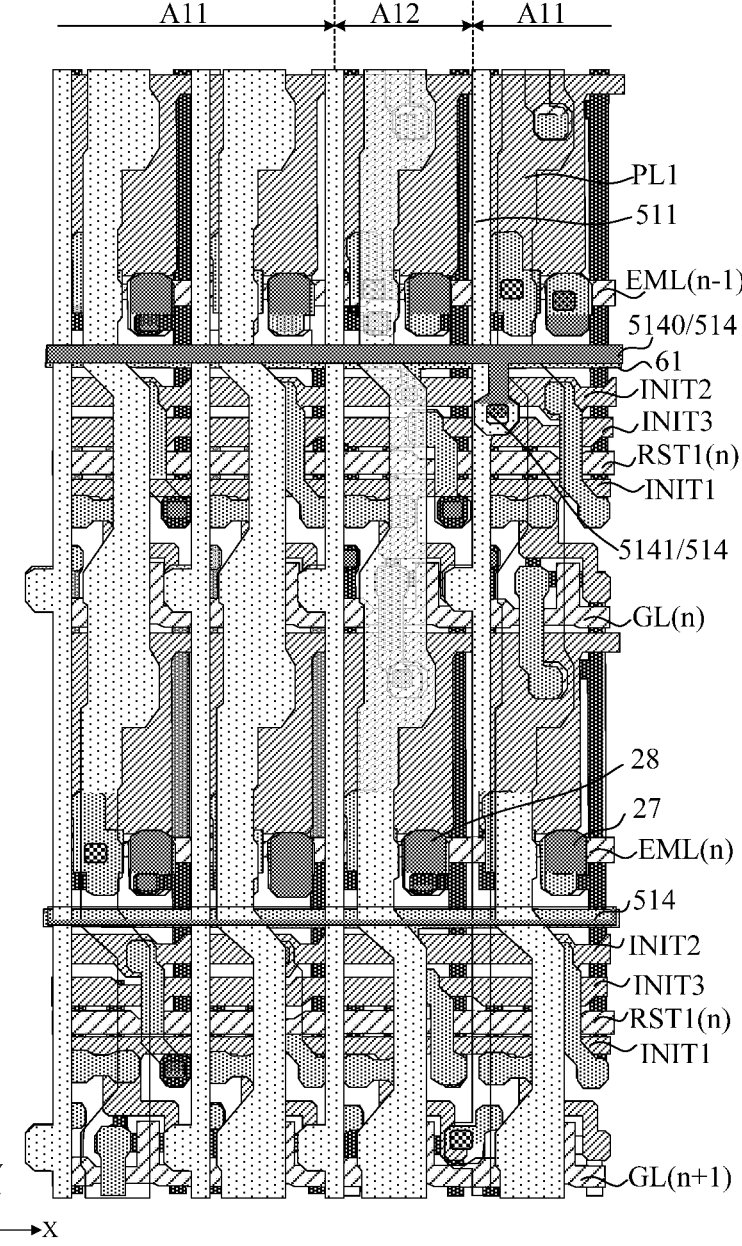
FIG. 26 is another partial plan schematic diagram of a first display region according to at least one embodiment of the present disclosure.
Figure 27:
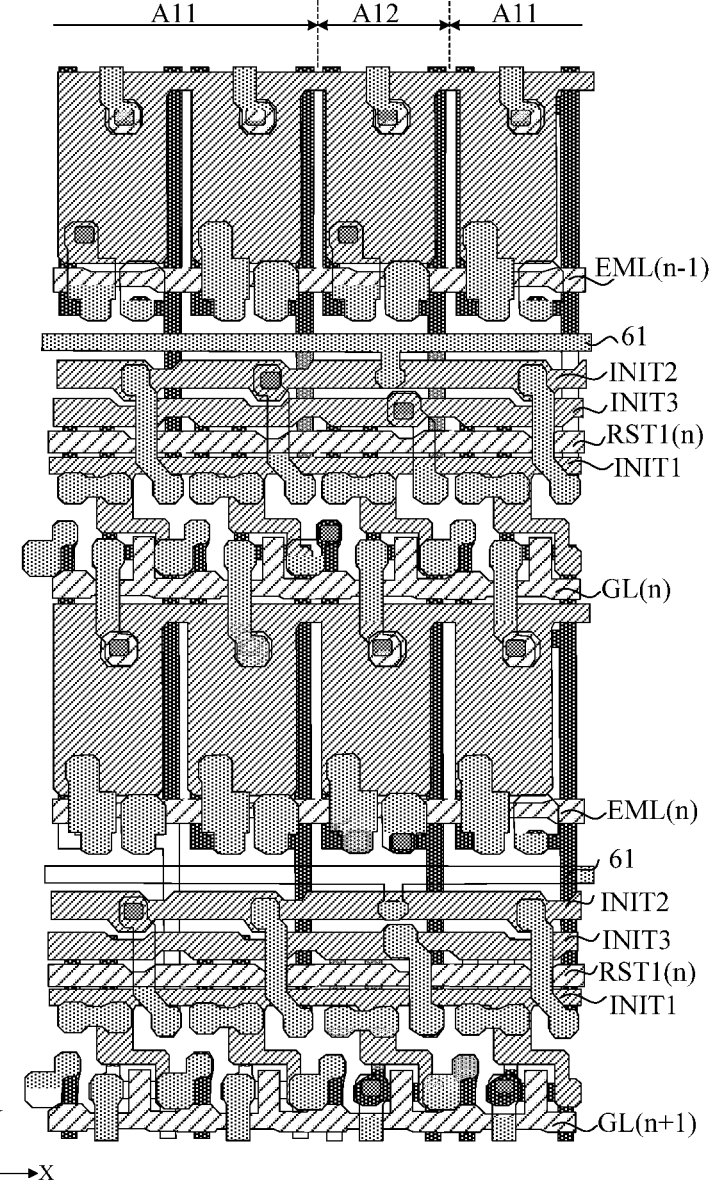
FIG. 27 is a partial plan schematic diagram of a first display region after a third conductive layer is formed in FIG. 26.

FIG. 26 is another partial plan schematic diagram of a first display region according to at least one embodiment of the present disclosure. FIG. 27 is a partial plan schematic diagram of a first display region after a third conductive layer is formed in FIG. 26.

In some examples, as shown in FIG. 26 and FIG. 27, the circuit structure layer of the first display region may include a semiconductor layer, a first conductive layer to a fifth conductive layer arranged on the substrate. The first data transfer line 514 may be located in the fifth conductive layer, and the first sub-data line 511 may be located in the fourth conductive layer. The first shielding wire 61 may be located in the third conductive layer. The second conductive layer of the first display region may at least include: a plurality of first initial signal lines INIT1, a plurality of second initial signal lines INIT2, and a plurality of third initial signal lines INIT3. A third insulation layer is arranged between the second conductive layer and the third conductive layer. The first shielding wire 61 may be electrically connected to the second initial signal line INIT2 through a via hole opened in the third insulation layer.

In some examples, the first shielding wire 61 may include a shielding main body extending along the first direction X and a connection portion extending from the shielding main body along the second direction X. The connection portion of the first shielding wire 61 may be electrically connected to the second initial signal line INIT2 through a via hole opened in the third insulation layer. The first shielding wire 61 may include a plurality of connection portions to achieve a parallel electrical connection to the second initial signal line INIT2. An orthographic projection of the shielding main body of the first shielding wire 61 on the substrate may not be overlapped with or may at least partially overlapped with the orthographic projection of the second initial signal line INIT2 on the substrate. The orthographic projection of the first data transfer line 514 on the substrate may be partially overlapped with the orthographic projection of the first shielding wire 61 on the substrate.

Rest of the structure of the display substrate according to this embodiment may refer to descriptions of the aforementioned embodiments, and will not be repeated herein.

In other examples, the first shielding wire may be electrically connected in parallel with the third initial signal line. This embodiment is not limited thereto.

Figure 28:
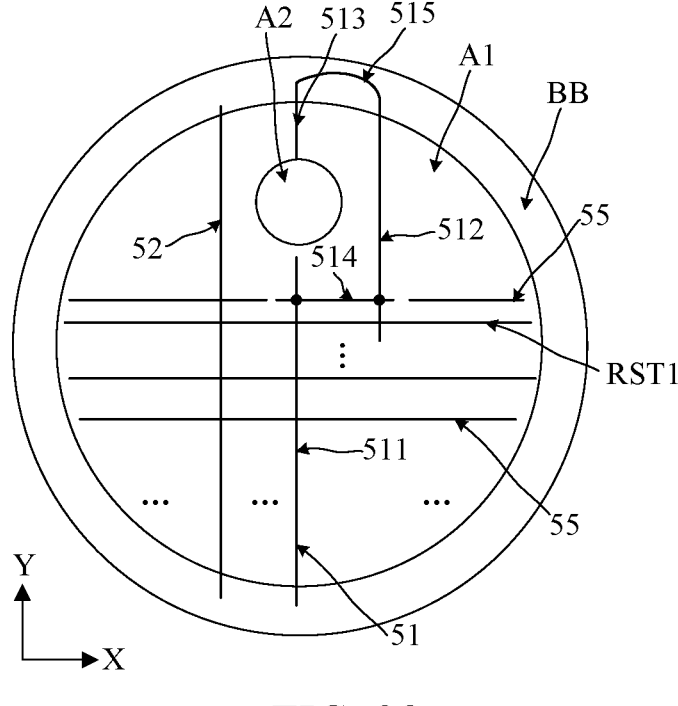
FIG. 28 is another schematic diagram of a display substrate according to at least one embodiment of the present disclosure.

FIG. 28 is another schematic diagram of a display substrate according to at least one embodiment of the present disclosure. In FIG. 28, it is illustrated by taking only one first data line 51 and one second data line 52 as examples. In some examples, as shown in FIG. 28, the first display region A1 may include a plurality of first compensation wires 55. The first compensation wire 55 and the first data transfer line 514 may be arranged in the same layer. For example, the first compensation wire 55 and the first data transfer line 514 may both be located in the fifth conductive layer. An extension direction of the first compensation wire 55 and an extension direction of the first data transfer line 514 may be the same, which both extend, for example, along the first direction X. A fracture may be provided between the first data transfer line 514 and the first compensation wire 55. The first compensation wire 55 may extend to the peripheral region BB, and be electrically connected to a peripheral power supply line of the peripheral region. For example, the first compensation wire 55 may be configured to transmit a first voltage signal or a second voltage signal. Rest of the structure of the display substrate according to this embodiment may refer to descriptions of the aforementioned embodiments, and will not be repeated herein.

The display substrate provided in this example may improve the poor appearance caused by the arrangement of the first data transfer line by providing a first compensation line in a region other than the first data transfer line.

An embodiment of the present disclosure provides a display substrate, including a substrate, a plurality of pixel circuits, a plurality of light emitting elements, at least one first reset control line, at least one first data line and at least one first shielding wire. The substrate includes a first display region and a second display region, wherein the first display region at least partially surrounds the second display region. The plurality of pixel circuits are located in the first display region and include a plurality of first pixel circuits and a plurality of second pixel circuits. The plurality of light emitting elements include a plurality of first light emitting elements located in the first display region and a plurality of second light emitting elements located in the second display region. At least one first pixel circuit in the plurality of first pixel circuits is electrically connected with at least one first light emitting element in the plurality of first light emitting elements; and at least one second pixel circuit in the plurality of second pixel circuits is electrically connected with at least one second light emitting element in the plurality of second light emitting elements. The first reset control line is electrically connected to a plurality of pixel circuits arranged along the first direction. The first data line at least includes a first sub-data line, a second sub-data line and a first data transfer line. The first sub-data line is electrically connected to a plurality of pixel circuits in the first display region located on a side of the second display region in the second direction, and the second sub-data line is electrically connected to a plurality of second pixel circuits in the first display region located on a side of the second display region in the first direction. The first data transfer line extends at least along the first direction and electrically connects the first sub-data line and the second sub-data line. The first direction intersects with the second direction. At least one conductive layer is arranged between a film layer on which the first reset control line is located and a film layer on which the first data transfer line is located, and the first shielding wire is located in the conductive layer; and an orthographic projection of the first shielding wire on the substrate is overlapped with an orthographic projection of the first data transfer line on the substrate, or the orthographic projection of the first shielding wire on the substrate is located between an orthographic projection of the first reset control line on the substrate and the orthographic projection of the first data transfer line on the substrate.

In some examples, at least two conductive film layers may be arranged between the film layer on which the first reset control line is located and the film layer on which the first data transfer line is located, and the first shielding wire may be located in the conductive layer close to the first reset control line among the at least two conductive layers. For example, three conductive film layers may be arranged between a film layer where the first reset control line is located and a film layer where the first data transfer line is located. The first reset control line is located in the first conductive layer, the first data transfer line is located in the fifth conductive layer, and a second conductive layer, a third conductive layer and a fourth conductive layer are provided between the first reset control line and the first data transfer line. The first shielding wire may be located in the second conductive layer.

In some examples, the first shielding wire may be electrically connected to the peripheral power supply line or the initial signal line within the first display region.

Relevant description of the display substrate of the present embodiment may refer to the descriptions in the aforementioned embodiments, and thus will not be repeated here.

An embodiment of the present disclosure further provides a display apparatus, which includes the aforementioned display substrate.

Figure 29:
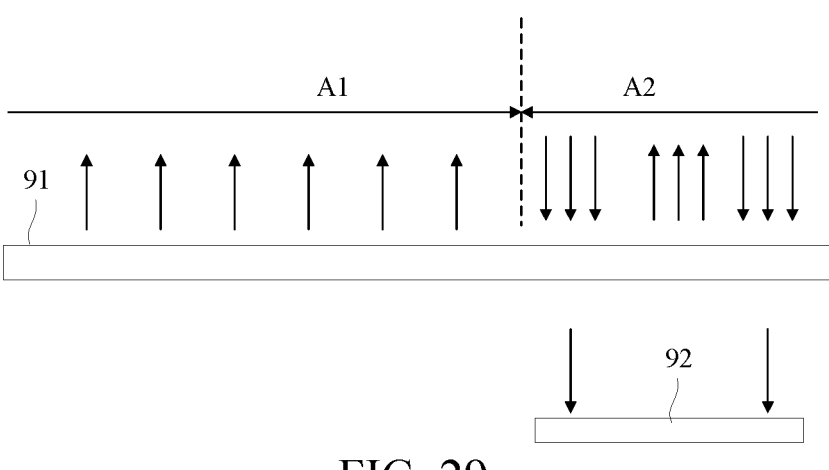
FIG. 29 is a schematic diagram of a display device according to at least one embodiment of the present disclosure.

FIG. 29 is a schematic diagram of a display device according to at least one embodiment of the present disclosure. As shown in FIG. 29, the present embodiment provides a display apparatus, which includes a display substrate 91 and a sensor 92 located on a side away from a non-display surface of the display substrate 91. An orthographic projection of the sensor 92 on the display substrate 91 is overlapped with the second display region A2.

In some examples, the display substrate 91 may be a flexible OLED display substrate, a QLED display substrate, a Micro-LED display substrate, or a Mini-LED display substrate. The display apparatus may be any product or component with a display function such as an OLED display, a cell phone, a tablet, a television, a display, a laptop, a digital photo frame, and a navigator, and the embodiment of the present disclosure is not limited thereto.

The drawings of the present disclosure only involve structures involved in the present disclosure, and other structures may refer to conventional designs. The embodiments of the present disclosure and features in the embodiments may be combined to each other to obtain new embodiments if there is no conflict. Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, comprising:
a substrate, comprising a first display region and a second display region, wherein the second display region is at least partially surrounded by the first display region;
a plurality of pixel circuits, located in the first display region, and comprising a plurality of first pixel circuits and a plurality of second pixel circuits;
a plurality of light emitting elements, comprising a plurality of first light emitting elements located in the first display region and a plurality of second light emitting elements located in the second display region, wherein at least one first pixel circuit of the plurality of first pixel circuits is electrically connected with at least one first light emitting element of the plurality of first light emitting elements; and at least one second pixel circuit of the plurality of second pixel circuits is electrically connected with at least one second light emitting element of the plurality of second light emitting elements;
at least one first reset control line, electrically connected with the plurality of pixel circuits arranged along a first direction;
at least one first data line, wherein the first data line at least comprises: a first sub-data line, a second sub-data line and a first data transfer line; the first sub-data line is electrically connected to the plurality of pixel circuits within the first display region on a side of the second display region in a second direction, and the second sub-data line is electrically connected to the plurality of second pixel circuits in the first display region on a side of the second display region in the first direction; the first data transfer line is extended at least along the first direction, and electrically connected with the first sub-data line and the second sub-data line; the first direction is intersected with the second direction; and
at least one first shielding wire, extending along the first direction, wherein
in a direction perpendicular to the display substrate, the first shielding wire is located between the first reset control line and the first data transfer line; and at least a portion of an orthographic projection of the first shielding wire on the substrate is located between an orthographic projection of the first data transfer line on the substrate and an orthographic projection of the first reset control line on the substrate.

2. The display substrate according to claim 1, wherein orthographic projection of the first shielding wire on the substrate is overlapped with the orthographic projection of the first data transfer line on the substrate.

3. The display substrate according to claim 1, wherein the first data transfer line comprises a main body portion extending along the first direction, and a protrusion portion extending from the main body portion in the second direction;
the orthographic projection of the first shielding wire on the substrate at least covers an edge of the main body potion of the first data transfer line close the first reset control line; or
the orthographic projection of the first shielding wire on the substrate is not overlapped with the orthographic projection of the main body portion of the first data transfer line on the substrate.

4. The display substrate according to claim 3, wherein the orthographic projection of the main body portion of the first data transfer line on the substrate is within a range of the orthographic projection of the first shielding wire on the substrate.

5. The display substrate according to claim 1, wherein:
at least one pixel circuit of the plurality of pixel circuits comprises an anode reset transistor, the anode reset transistor is connected electrically to a second initial signal line or a third initial signal line, and is configured to reset an anode connection node of the pixel circuit by using a second initial signal provided by the second initial signal line or a third initial signal provided by the third initial signal line; and
the first shielding wire is electrically connected to the second initial signal line or the third initial signal line.

6. The display substrate according to claim 5, wherein the anode reset transistor of the first pixel circuit is electrically connected to the second initial signal line, and the anode reset transistor of the second pixel circuit is electrically connected to the third initial signal line.

7. The display substrate according to claim 5- or 6, wherein the first shielding wire, the second initial signal line or the third initial signal line are of an integral structure.

8. The display substrate according to claim 5, wherein an insulation layer is provided between a film layer on which the first shielding wire is located and a film layer on which the second initial signal line or the third initial signal line is located, and the first shielding wire is electrically connected in parallel with the second initial signal line or the third initial signal line through a via hole opened on the insulation layer.

9. The display substrate according to claim 5, further comprising: at least one first shielding electrode, which is located on a side of a transfer hole between the first data transfer line and the first sub-data line or the second sub-data line close to the first reset control line, and the first shielding electrode is electrically connected to the second initial signal line or the third initial signal line.

10. The display substrate according to claim 9, wherein an orthographic projection of the first shielding electrode on the substrate is overlapped with the orthographic projection of the first reset control line on the substrate.

11. The display substrate according to claim 5, wherein the at least one pixel circuit further comprises: a first reset transistor and a drive transistor, wherein the first reset transistor is electrically connected to the first reset control line, a first initial signal line and a gate of the drive transistor, and is configured to reset the gate of the drive transistor by using a first initial signal provided by the first initial signal line under control of the first reset control line; and
an orthographic projection of the first initial signal line on the substrate is located on a side of the orthographic projection of the first reset control line on the substrate close to the drive transistor.

12. The display substrate according to claim 1, wherein the first shielding wire is electrically connected to a peripheral power supply line.

13. The display substrate according to claim 1, wherein the first reset control line, the first shielding wire, and the first data transfer line are arranged sequentially along a direction away from the substrate.

14. The display substrate according to claim 13, wherein the first reset control line is located in a first conductive layer, the first shielding wire is located in a second conductive layer, the second conductive layer is located on a side of the first conductive layer away from the substrate, and an inorganic insulation layer is arranged between the first conductive layer and the second conductive layer; and the first data transfer line is located on a side of the second conductive layer away from the substrate.

15. The display substrate according to claim 1, wherein the first data transfer line is located on a side of the first sub-data line and the second sub-data line close to the substrate, and the first sub-data line and the second sub-data line are in a same layer.

16. The display substrate according to claim 1, wherein the first data transfer line is located on a side of the first sub-data line and the second sub-data line away from the substrate, the first sub-data line and the second sub-data line are in a same layer, the first sub-data line is located on a side of the first shielding wire away from the substrate, and at least one conductive layer is provided between a film layer on which the first sub-data line is located and a film layer on which the first shielding wire is located.

17. The display substrate according to claim 16, further comprising: a plurality of first compensation wires; and the plurality of first compensation wires and the first data transfer line are arranged in the same layer, and an extension direction of the plurality of first compensation wires is the same as an extension direction of the first data transfer line.

18. The display substrate according to claim 17, wherein the plurality of first compensation wires are electrically connected to a peripheral power supply line.

19. A display apparatus, comprising a display substrate according to claim 1.

20. A display substrate, comprising:

a substrate, comprising a first display region and a second display region, wherein the second display region is at least partially surrounded by the first display region;

a plurality of pixel circuits, located in the first display region, and comprising a plurality of first pixel circuits and a plurality of second pixel circuits;

a plurality of light emitting elements, comprising a plurality of first light emitting elements located in the first display region and a plurality of second light emitting elements located in the second display region; at least one first pixel circuit of the plurality of first pixel circuits is electrically connected with at least one first light emitting element of the plurality of first light emitting elements; at least one second pixel circuit of the plurality of second pixel circuits is electrically connected with at least one second light emitting element of the plurality of second light emitting elements;

at least one first reset control line, electrically connected with the plurality of pixel circuits arranged along a first direction;

at least one first data line, wherein the first data line at least comprises: a first sub-data line, a second sub-data line and a first data transfer line; the first sub-data line is electrically connected to a plurality of pixel circuits within the first display region on a side of the second display region in a second direction, and the second sub-data line is electrically connected to a plurality of second pixel circuits in the first display region on a side of the second display region in the first direction; the first data transfer line is extended at least along the first direction, and electrically connected with the first sub-data line and the second sub-data line; the first direction is intersected with the second direction;

at least one first shielding wire, extending along the first direction;

at least one conductive layer is arranged between a film layer on which the first reset control line is located and a film layer on which the first data transfer line is located, and the first shielding wire is located in the conductive layer; and an orthographic projection of the first shielding wire on the substrate is overlapped with an orthographic projection of the first data transfer line on the substrate, or the orthographic projection of the first shielding wire on the substrate is located between an orthographic projection of the first reset control line on the substrate and the orthographic projection of the first data transfer line on the substrate.

* * * * *